United States Patent
Okahiro et al.

(10) Patent No.: US 9,472,264 B2
(45) Date of Patent: Oct. 18, 2016

(54) SEMICONDUCTOR MEMORY DEVICE HAVING SENSE AMPLIFIER

(71) Applicant: Micron Technology, Inc., Boise, ID (US)

(72) Inventors: Tetsuaki Okahiro, Tokyo (JP); Ryuji Takishita, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/657,912

(22) Filed: Mar. 13, 2015

(65) Prior Publication Data

US 2015/0262650 A1    Sep. 17, 2015

(30) Foreign Application Priority Data

Mar. 14, 2014  (JP) ................... 2014-051382

(51) Int. Cl.
*G11C 11/4091* (2006.01)
*G11C 11/4074* (2006.01)

(52) U.S. Cl.
CPC ........ *G11C 11/4091* (2013.01); *G11C 11/4074* (2013.01)

(58) Field of Classification Search
CPC ................. G11C 11/4091; G11C 11/4074
USPC ................................... 365/189.011
See application file for complete search history.

(56) References Cited

U.S. PATENT DOCUMENTS

| 7,372,746 B2* | 5/2008 | Kim ............... G11C 7/08 365/189.06 |
| 7,929,367 B2* | 4/2011 | Yoo ............... G11C 7/065 365/189.05 |
| 2008/0008014 A1 | 1/2008 | Matano |
| 2008/0112244 A1 | 5/2008 | Teramoto et al. |
| 2008/0151674 A1 | 6/2008 | Ohata et al. |
| 2010/0103758 A1 | 4/2010 | Riho et al. |

FOREIGN PATENT DOCUMENTS

| JP | 2008-016145 | 1/2008 |
| JP | 2008-123609 | 5/2008 |
| JP | 2008-159188 | 7/2008 |
| JP | 2010-102808 | 5/2010 |

* cited by examiner

*Primary Examiner* — Hoai V Ho
*Assistant Examiner* — Tri Hoang
(74) *Attorney, Agent, or Firm* — Dorsey & Whitney LLP

(57) ABSTRACT

An apparatus includes a memory cell, a bit line coupled to the memory cell, and a sense amplifier configured to amplify a data signal on the bit line read out from the memory cell. The sense amplifier is operated in a first mode with a first power source voltage difference and operated in a second mode with a second power source voltage difference smaller than the first power source voltage difference.

20 Claims, 21 Drawing Sheets

US 9,472,264 B2

SEMICONDUCTOR MEMORY DEVICE HAVING SENSE AMPLIFIER

This application is based upon and claims the benefit of priority from Japanese Patent Application No. 2014-051382 filed on Mar. 14, 2014, the disclosure of which are incorporated herein in its entirely by reference.

BACKGROUND

1. Field of the Invention

The present invention relates to a semiconductor device, and in particular, to such a semiconductor device provided with a sense amplifier for amplifying a potential difference between bit lines.

2. Description of Prior Art

The semiconductor device such as a DRAM (Dynamic Random Access Memory) is designed to amplify a potential difference appearing between a pair of bit lines by using a sense amplifier. A generally-used sense amplifier is constituted by N channel-type MOS transistors cross-coupled with each other and P channel-type MOS transistors cross-coupled with each other, and when an operation voltage is supplied to a common source of each transistor, the potential difference between the paired bit lines is amplified. Moreover, semiconductor devices disclosed in JP-A No. 2008-16145, JP-A No. 2008-159188 and JP-A No. 2010-102808 are designed to overdrive the common source in the initial stage of the sensing operation in order to improve a sensing speed.

The common source of the sense amplifier is equalized to the same electric potential during a precharge period. When an active command is issued, an operation voltage is supplied to the common source, thereby bringing to a state where a reading operation or a writing operation can be carried out through the sense amplifier. This state continues until a precharge command has been issued.

In this case, however, when an operation voltage of a restore level has been continuously supplied to the common source during all the period from the issuance of the active command to the issuance of the precharge command, a problem arises in which a consumption current increases because of a leak current flowing through the sense amplifier. In order to solve this problem, JP-A No. 2008-123609 has proposed a method for equalizing the sense amplifier during one portion of the period from the issuance of the active command to the issuance of the precharge command.

However, in an attempt to equalize the sense amplifier during the active period, switching is required so as to separate the sense amplifier and the bit line from each other in the period. Moreover, since during the period in which the sense amplifier is being equalized, the bit line is brought into a floating state, information held in the memory cell might be lost when the equalizing period is long.

DETAILED DESCRIPTION OF THE EMBODIMENTS

Preferred embodiments of the present invention will be hereinafter described in detail while referencing the accompanying drawings.

Figure 1:
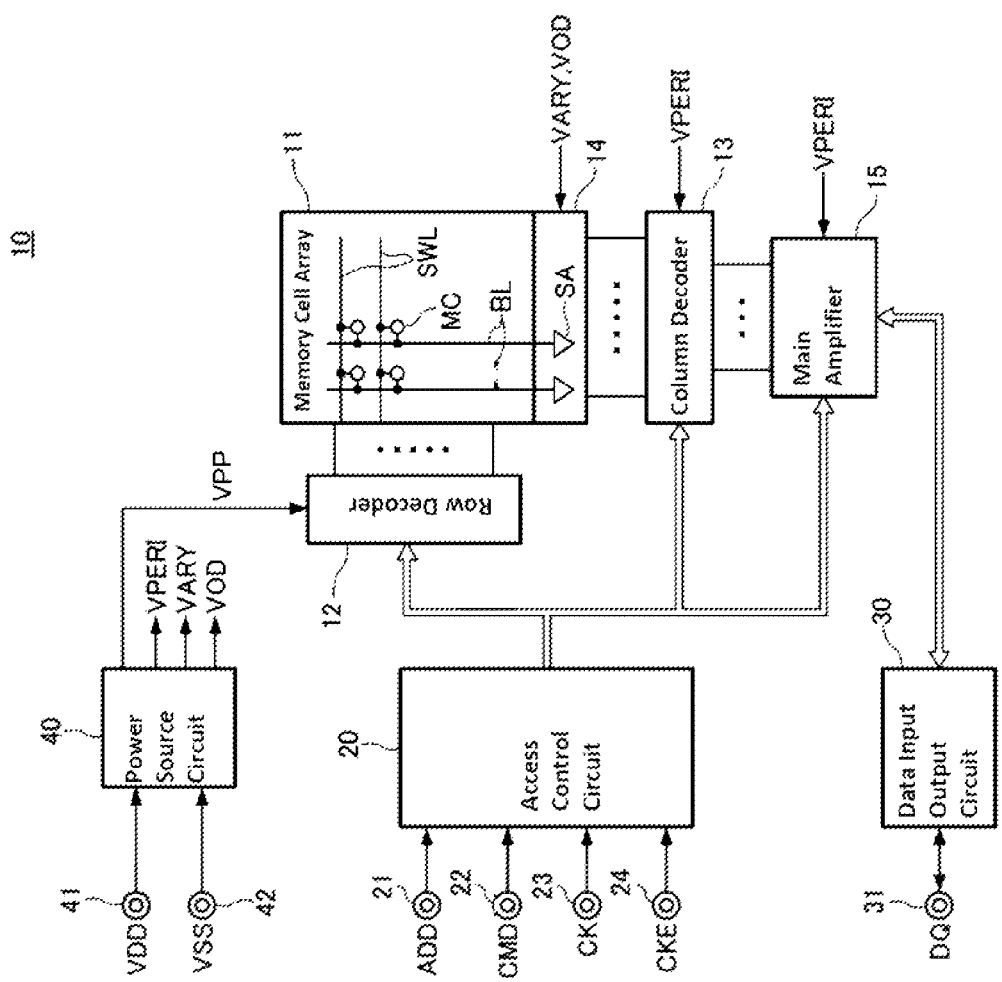
FIG. 1 is a block diagram showing a configuration of a semiconductor device in accordance with a preferred embodiment of the present invention.

FIG. 1 is a block diagram showing an entire configuration of a semiconductor device 10 in accordance with a preferred embodiment of the present invention.

The semiconductor device 10 in accordance with the present embodiment, which corresponds to a DRAM, includes a memory cell array 11 as shown in FIG. 1. The memory array 11 includes a plurality of sub-word lines SWL and a plurality of bit lines BL that intersect with each other, and memory cells MC formed on the intersections thereof. A row decoder 12 selects the sub-word lines SWL, and a column decoder 13 selects the bit lines BL. The bit lines BL are respectively connected to corresponding sense amplifiers SA inside a sense circuit 14, and the bit lines BL selected by the column decoder 13 are connected to a main amplifier 15 through the sense amplifiers SA.

The access control circuit 20 controls operations of the row decoder 12, the column decoder 13, the sense circuit 14 and the main amplifier 15. To the access control circuit 20, an address signal ADD, a command signal CMD, a clock signal CK, a clock enable signal CKE and the like are supplied through external terminals 21 to 24. Based upon these signals, the access control circuit 20 controls operations of the row decoder 12, the column decoder 13, the sense circuit 14, the main amplifier 15 and a data input/output circuit 30.

More specifically, in the case when the command signal CMD indicates an active command, the row decoder 12 receives an address signal ADD. In response to this, the row decoder 12 selects a sub-word line SWL indicated by the address signal ADD so that the corresponding memory cells MC are thus respectively connected to the bit line BL. Thereafter, the access control circuit 20 activates the sense circuit 14 at predetermined timings.

In the case when the command signal CMD indicates a read command or a write command, the column decoder 13 receives an address signal ADD. In response to this, the column decoder 13 connects the bit line BL indicated by the address signal ADD to the main amplifier 15. Thus, at the time of a reading operation, read data DQ is read from the memory cell array 11 through the sense amplifier SA, and successively outputted externally from a data terminal 31 through the main amplifier 15 and the data input/output circuit 30. Moreover, at the time of a writing operation, write data DQ is externally supplied through the data terminal 31 and the data input/output circuit 30, and successively written in the memory cell MC through the main amplifier 15 and the sense amplifier SA.

In the case when the clock enable signal CKE indicates a power down command, the access control circuit 20 allows the semiconductor device 10 to enter a power down mode. When the semiconductor device 10 has entered the power down mode, a low current consumption state is exerted in which neither the reading operation nor the writing operation is carried out.

These respective circuit blocks use respectively predetermined internal voltages as operation power supplies. These internal power supplies are generated by a power supply circuit 40 shown in FIG. 1. The power supply circuit 40 receives an external electric potential VDD and a ground electric potential VSS respectively supplied thereto through power supply terminals 41 and 42, and based upon these, generates internal voltages VPP, VPERI, VARY, VOD, etc. The internal electric potential VPP is generated by raising the external electric potential VDD, and the internal electric potentials VPERI, VARY and VOD are generated by lowering the external electric potential VDD.

The internal voltage VPP is a voltage mainly used for the row decoder 12. The row decoder 12 drives the sub-word line SWL selected based upon the address signal ADD to a VPP level so that the cell transistors contained in the memory cell MC are subsequently conducted. The internal voltages VARY and VOD are voltages mainly used for the sense circuit 14. When the sense circuit 14 is activated, one of the paired bit lines is driven to a VARY level, while the other is driven to a VSS level, so as to amplify the read data thus read out. Moreover, in the initial stage of the sensing operation, by overdriving one of the bit paired lines to the VOD level, a high-speed sensing operation can be carried out. The internal voltage VPERI is used for an operation voltage of most of the peripheral circuits, such as the access control circuit 20. By using the internal voltage VPERI having a lower voltage than that of the external voltage VDD as the operation voltage of these peripheral circuits, a low power consumption of the semiconductor device 10 can be achieved.

Figure 2:
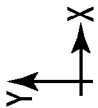
FIG. 2 is a plan view showing a structure of a memory cell.

FIG. 2 is a plan view showing a configuration of the memory cell array 11.

As shown in FIG. 2, the memory array 11 includes a plurality of memory mats MAT that are laid-out in a matrix pattern. A sub-word driver region SW is formed between two memory mats MAT that are adjacent to each other in an X direction. On the other hand, a sense amplifier region SAA is formed between two memory mats MAT that are adjacent to each other in a Y direction. Moreover, in a region where the row of the sub-word driver regions SW that extend in the Y direction and the row of the sense amplifier regions SAA that extend in the X direction intersect with each other, a sub-word cross region SX is formed. A sub-amplifier for driving main input/output lines to be described later, etc. are installed in the sub-word cross region SX.

Figure 3:
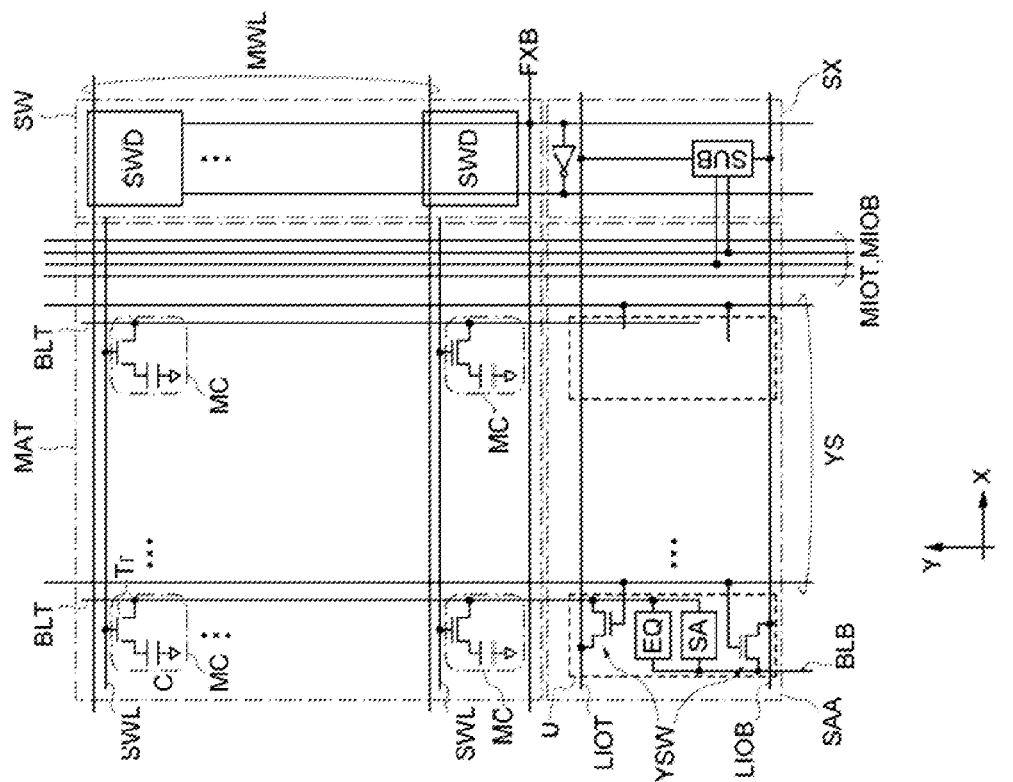
FIG. 3 is a plan view showing a further enlarged state of one portion of the memory cell.

FIG. 3 is a plan view showing one portion of the memory cell array 11 in a further enlarged manner.

As shown in FIG. 3, in the memory cell array 11, paired local input/output lines LIOT, LIOB that extend in the X direction and paired main input/output lines MIOT, MIOB that extend in the Y direction are installed. The paired local input/output lines LIOT, LIOB and the paired main input/output lines MIOT, MIOB are data input/output lines that are hierarchically configured.

The paired local input/output lines LIOT, LIOB transmit read data read out from the memory cell MC and write data to be written in the memory cell MC within the memory cell array 11. The paired local input/output lines LIOT, LIOB are data input/output lines of a differential type for transmitting the read data and write data by using a pair of lines. The paired local input/output lines LIOT, LIOB are laid out in the X direction on the sense amplifier region SAA and the sub-word cross region SX.

The paired main input/output lines MIOT, MIOB transmit read data from the memory cell array 11 to the main amplifier 15, and also transmit write data from the main amplifier 15 to the memory cell array 11. The paired main input/output lines MIOT, MIOB are data input/output lines of a differential type for transmitting the read data and write data by using the paired lines. The paired main input/output lines MIOT, MIOB are laid out in the Y direction on the memory mat MAT and the sense amplifier region SAA. A large number of the paired main input/output lines MIOT, MIOB that extend in the Y direction are installed in parallel with each other and connected to the main amplifier 15.

Inside the memory MAT, memory cells MC are disposed at intersections between the sub-word lines SWL that extend in the X direction and the bit line BLT or BLB that extends in the Y direction. Each memory cell MC has a configuration in which a cell transistor Tr and a cell capacitor C are connected in series with each other between the corresponding bit line BLT or BLB and a plate line (for example, a precharge line). The cell transistor Tr includes an N-channel-type MOS transistor, with its gate electrode being connected to the corresponding sub-word line SWL.

In the sub-word driver region SW, a large number of sub-word drivers SWD are installed. Based upon a row address, each of the sub-word drivers SWD drives the corresponding sub-word line SWL.

Moreover, to each sub-word driver SWD, a main word line MWL and a word driver selection line FXB are connected. On the single sub-word driver SWD, for example, 8 word driver selection lines FXB are disposed. Of four sub-word drivers SWD selected by the single main word line MWL, one sub-word line SWL is activated by selecting any one of them by the paired word driver selection lines FXB.

In the sense amplifier region SAA, a large number of sense amplifiers SA, equalize circuits EQ and column switches YSW are installed. Each sense amplifier SA and each equalize circuit EQ are connected to the corresponding paired bit lines BLT, BLB. The semiconductor device in accordance with the present embodiment has a so-called open bit line structure. In other words, the paired bit lines BLT and BLB connected to the same sense amplifier SA are disposed on respectively different memory mats MAT (that is, two memory mats adjacent to each other in the Y direction). The sense amplifier SA amplifies a potential difference appearing on these paired bit lines BLT and BLB, and the equalize circuit EQ equalizes the paired bit lines BLG and BLB to the same electric potential. Read data amplified by the sense amplifier SA are first transmitted to the paired local input/output lines LIOT, LIOB, and then further transmitted to the paired main input/output lines MIOT, MIOB.

Each column switch YSW is installed between the corresponding sense amplifier SA and paired local input/output lines LIOT, LIOB. The column switch YSW connects the sense amplifier and the local paired local input/output lines to each other by activating the corresponding column selection signal YS to a high level. The column selection signal YS is generated by the column decoder 13 based upon the column address.

In the sub-word cross region SX, a plurality of sub-amplifiers SUB are installed. The plurality of sub-amplifiers SUB are installed for each of the sub-word cross regions SX so as to drive the corresponding paired main input/output lines MIOT, MIOB. The input terminal of each of the sub-amplifiers SUB is connected to the corresponding paired local input/output lines LIOT, LIOB. The output terminal of each of the sub-amplifiers SUB is connected to the corresponding paired main input/output lines MIOT, MIOB. Based upon data on the corresponding paired local input/output lines LIOT, LIOB, each of the sub-amplifiers SUB drives the respective paired main input/output lines MIOT, MIOB. Additionally, in place of the sub-amplifiers SUB, a so-called pass gate that connects the paired main input/output lines MIOT, MIOB to the paired local input/output lines LIOT, LIOB by using N-channel-type MOS transistors, may be used.

As described above, the paired main input/output lines MIOT, MIOB are installed in a manner so as to cross the memory mats MAT. Moreover, one end of each of the paired main input/output lines MIOT, MIOB is connected to the main amplifier 15. Thus, the data read out by using the sense amplifier SA is transferred to the sub-amplifiers SUB through the paired local input/output lines LIOT, LIOB, and then further transferred to the main amplifier 15 through the paired main input/output lines MIOT, MIOB. The main amplifier 15 further amplifies the data supplied thereto through the paired main input/output lines MIOT, MIOB.

Figure 4:
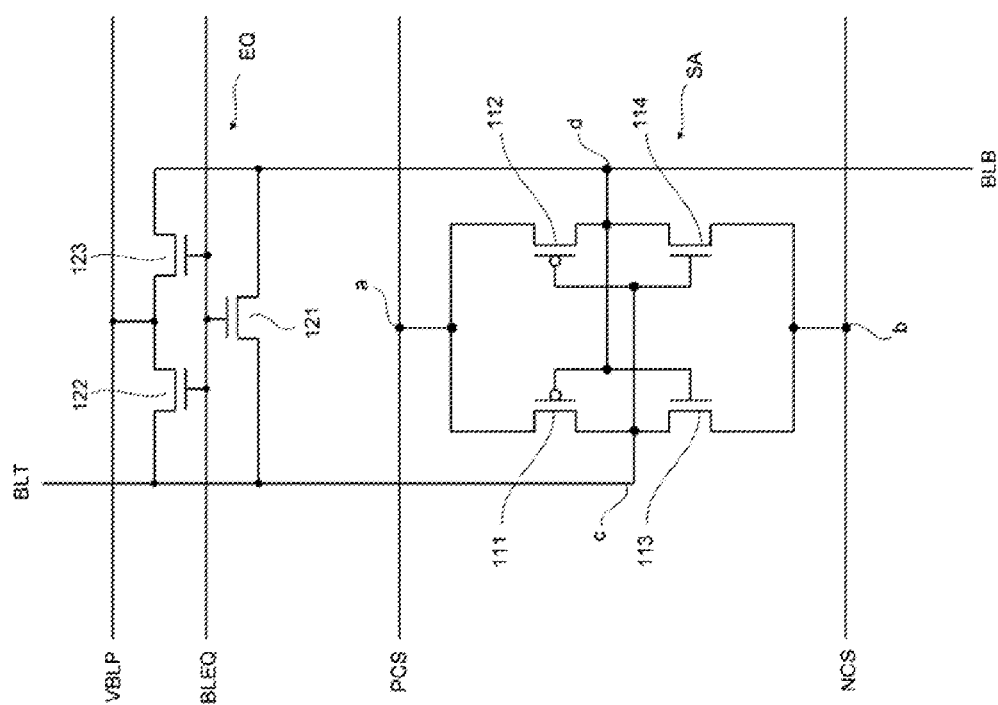
FIG. 4 is a circuit diagram showing a sense amplifier and an equalize circuit EQ.

FIG. 4 is a circuit diagram showing the sense amplifier SA and equalize circuit EQ.

As shown in FIG. 4, the sense amplifier SA includes P-channel-type MOS transistors 111 and 112 cross-coupled with each other and N-channel-type MOS transistors 113 and 114 cross-coupled with each other. The sources of the transistors 111 and 113 are series-connected between the power supply nodes a and b, and these contacts are connected to one of signal nodes c, and the gate electrodes of these are connected to the other signal node d. In the same manner, the sources of the transistors 112 and 114 are series-connected between the power supply nodes a and b, and these contacts are connected to one of signal nodes d, and the gate electrodes of these are connected to the other signal node c. The signal node c is connected to the bit line BLT, and the signal node d is connected to the bit line BLB. Moreover, the power supply node a is connected to a common source line PCS, and the power supply node b is connected to a common source line NCS.

By using this flip-flop configuration, when a potential difference occurs between the paired bit lines BLT and BLB in a state where a predetermined operation voltage is supplied to the common source line PCS to which a high electric potential is supplied and the common source line NCS to which a low electric potential is supplied, the electric potential of the common source line PCS is supplied to one of the paired bit lines, while the electric potential of the common source line NCS is supplied to the other of the paired hit lines. The active electric potential of the common source line PCS is the array electric potential VARY, and the active electric potential of the common source line NCS is the ground electric potential VSS.

At the time before a sensing operation, the bit paired lines BLT and BLB are preliminarily equalized to a precharge electric potential VBLP by the equalize circuit EQ. When, after the equalizing process has been stopped, a predetermined sub-word line SWL is selected, and a charge that has been held on the memory cell MC is released to the corresponding bit line BLT or BLB so that a potential difference occurs between the two bit lines BLT and BLB. Thereafter, when an operation voltage is supplied between the common source lines PCS and NCS, the potential difference between the paired bit lines BLT and BLB is amplified.

The equalize circuit EQ has three N channel-type MOS transistors 121 to 123. The transistor 121 is connected between the bit paired lines BLT and BLB. The transistor 122 is connected between the bit line BLT and a line to which the precharge electric potential VBLP is supplied. The transistor 123 is connected between the bit line BLB and a line to which the precharge electric potential VBLP is supplied. A bit line equalize signal BLEQ is supplied to the gate electrodes of these transistors 121 to 123. By using this configuration, when the bit line equalize signal BLEQ is activated to a high level, the bit paired lines BLT and BLB are precharged to the precharge electric potential VBLP.

Moreover, in the present embodiment, the bit paired lines BLT, BLB and the sense amplifier SA are directly connected with each other, with no switch or the like being interposed therebetween. For this reason, when the bit paired lines BLT and BLB are equalized by the equalize circuit EQ, the common source lines PCS and NCS are also equalized to the same electric potential.

The common source lines PCS and NCS are driven by a driver circuit to be explained below.

Figure 5:
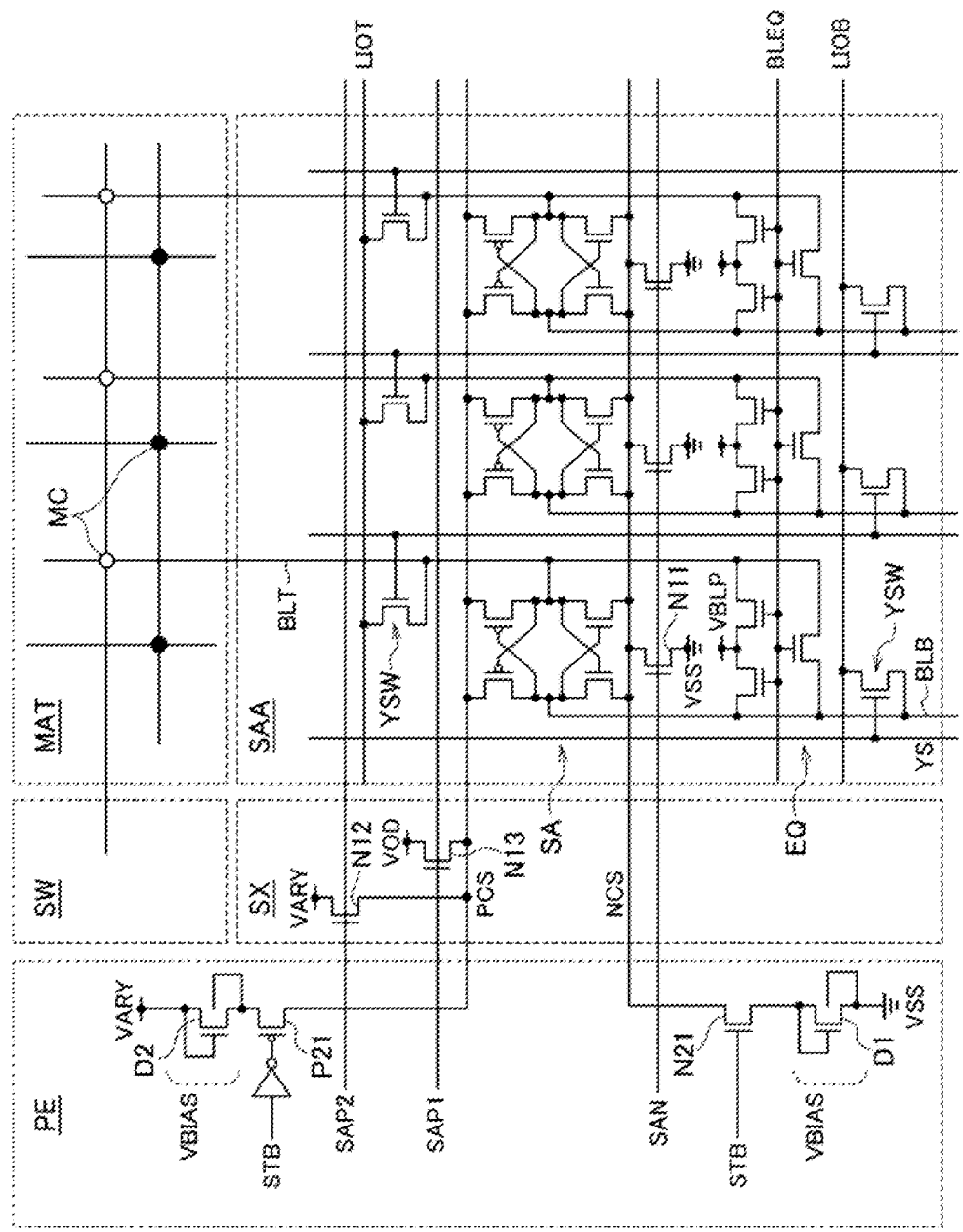
FIG. 5 is a circuit diagram showing a driver circuit in accordance with a first embodiment.

FIG. 5 is a circuit diagram showing a driver circuit in accordance with the first embodiment.

The driver circuit in accordance with the first embodiment includes a first driver circuit for supplying the first operation voltage (VARY) to the common source lines PCS and NCS, and a second driver circuit for supplying a second operation voltage (VARY−2VBIAS) to the common source lines PCS and NCS.

As shown in FIG. 5, the first driver circuit includes an N channel-type MOS transistor N11 connected between a line (VSS line) to which a ground electric potential VSS is supplied and the common source line NCS, an N channel-type MOS transistor N12 connected between a line (VARY line) to which an internal electric potential VARY is supplied and the common source line PCS and an N channel-type MOS transistor N13 connected between a line (over drive line) to which an overdrive electric potential VOD (>VARY) is supplied and the common source line PCS. In the present embodiment, the transistor N11 is disposed in the sense amplifier region SAA, and the transistors N12 and N13 are disposed in the sub-word cross region SX. The transistor N13 is an overdrive transistor for use in overdriving the common source line PCS.

The second driver circuit includes a diode D1 and an N channel-type MOS transistor N21 that are series-connected between the VSS line and the common source line NCS, and a diode D2 and a P channel-type MOS transistor P21 that are series-connected between the VARY line and the common source line PCS. The transistor N21 and the transistor N11 are exclusively turned on, and the transistor P21 and the transistors N12 and N13 are also exclusively turned on.

For example, any of the diodes D1 and D2 are constituted by, for example, N channel-type MOS transistors with its source-drain gap being short-circuited, and the voltage drop amount thereof (voltage between the gate and source) corresponds to VBIAS. In the present embodiment, any of the transistors N21, P21 and the diodes D1, D2 are disposed in a peripheral circuit region PE located on the external portion of the memory cell array 11.

As shown in FIG. 5, sense signals SAN, SAP2, SAP1 are respectively supplied to the gate electrodes of the transistors N11 to N13. Therefore, in the case when the sense signals SAN and SAP2 are activated to a high level, the first operation voltage VARY is supplied between the common source lines PCS and NCS. Moreover, in the case when the sense signals SAN and SAP1 are activated to a high level, an over drive voltage VOD higher than the first operation voltage VARY is supplied between the common source lines PCS and NCS.

A stand-by signal STB and its inversion signal are respectively supplied to the gate electrodes of the transistors N21 and P21. Thus, in the case when the stand-by signal STB is activated to a high level, the second operation voltage VARY−2VBIAS is supplied between the common source lines PCS and NCS.

These sense signals SAN, SAP2, SAP1 and stand-by signal STB are generated by the access control circuit 20 shown in FIG. 1.

Figure 6:
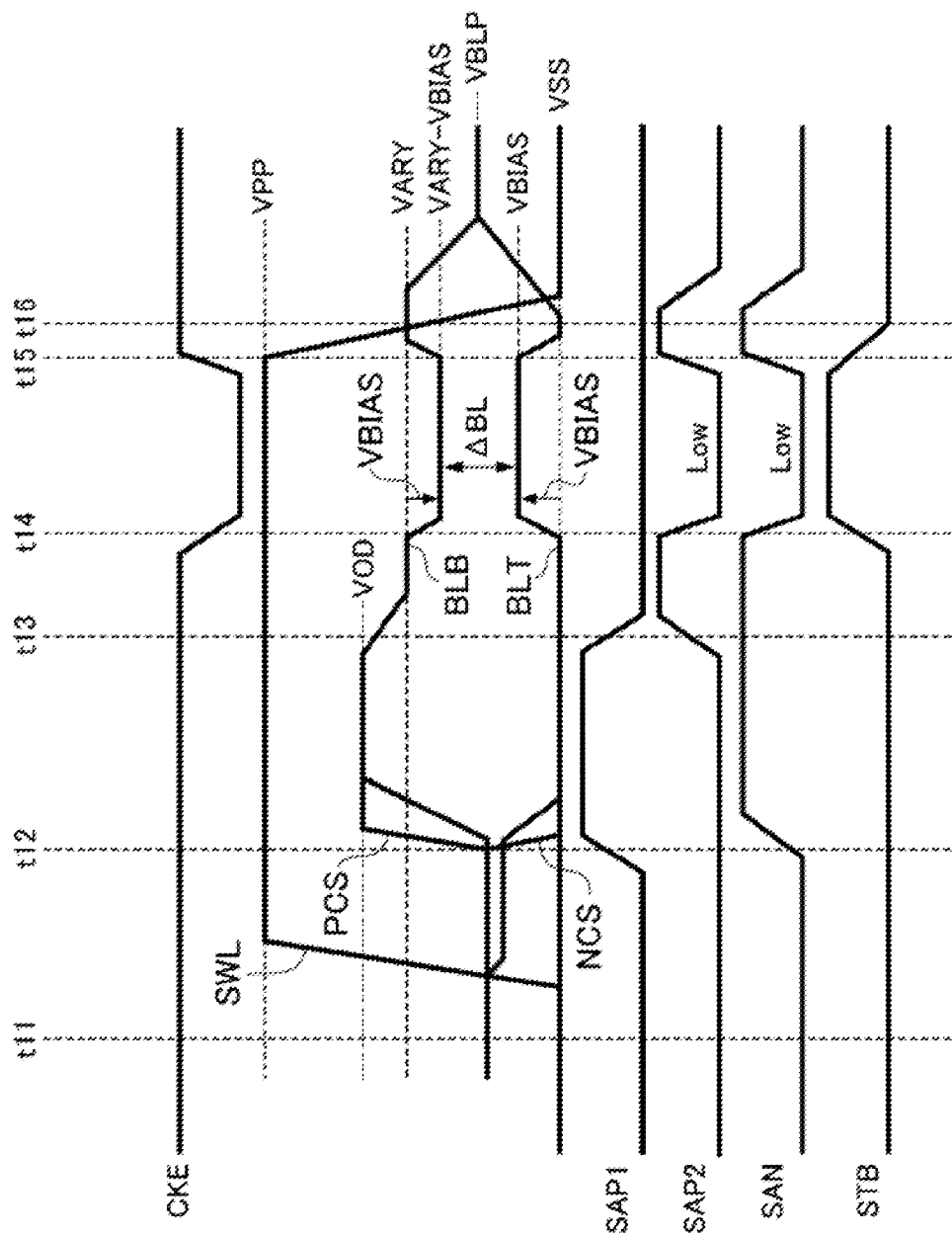
FIG. 6 is a waveform diagram that explains operations of the driver circuit in accordance with the first embodiment.

FIG. 6 is a waveform diagram for use in explaining operations of the driver circuit in accordance with the first embodiment.

Before time t11, the equalize signal BLEQ shown in FIG. 4 is kept at a high level, and any of the bit paired lines BLT, BLB and the common source lines PCS, NCS are equalized to the precharge voltage VBLP.

Moreover, when an active command is issued at time t11, the equalized state is released and a predetermined sub-word line SWL is driven to a VPP level based upon an inputted address signal ADD (row address). The released state from the equalization, that is, a non-active state of the equalize circuit EQ, continues from the issuance of the active command to the issuance of a precharge command. This is because, during this period, at least one of the transistors N11 to N13, N21 and P21 is turned on.

When the sub-word line SWL is driven to the VPP level, the cell transistor Tr of the corresponding memory cell MC is turned on so that the corresponding cell capacitor C is connected to the bit line BLT or BLB. As a result, the electric potential of the bit line BLT or BLB is slightly changed in accordance with the stored charge of the cell capacitor C. In an example shown in FIG. 6, a state in which the electric potential of the bit line BLT is slightly lowered.

Thereafter, at time t12, the sense signals SAN and SAP1 are activated to a high level. Thus, since the common source line PCS is driven to a VOD level, and since the common source line NCS is driven to a VSS level, the sense amplifier SA is activated. For this reason, in accordance with a potential difference between the paired bit lines BLT and BLB, the bit line BLT is sensed to the VSS level, and the bit line BLB is sensed to the VOD level.

After a predetermined period of time has elapsed, at time t13, the sense signal SAP1 is changed to a low level, and a sense signal SAP2 is changed to a high level. Thus, the over drive is completed so that the common source line PCS is set to the VARY level, and the common source line NCS is set to the VSS level. In accordance with this, the paired bit lines BLT and BLB are also set to the VSS level and the VARY level.

The above-mentioned sequence of operations are continuously executed in response to active commands, and the memory cell array 11 is subsequently activated. A state where the memory cell array 11 is activated is referred to as "active state". Although not shown in FIG. 6, when the memory cell array 11 is in the active state, a reading operation or a writing operation can be carried out on the memory cell array 11 by issuing a read command or a write command.

The active state of the memory cell array 11 is continuously maintained until the precharge command has been issued. Although not shown in FIG. 6, when the precharge command is issued, the sub-word line SWL is reset to the non-active level so that the memory cell array 11 is consequently inactivated.

On the other hand, when the clock enable signal CKE is changed to a low level during the period in which the memory cell array 11 is in the active state, the corresponding semiconductor device 10 is entered to a power down mode. That is, the change of the clock enable signal CKE from the high level to the low level means an issuance of a power down command. In the example shown in FIG. 6, the power down command is issued at time t14.

When the power down command is issued as shown in FIG. 6, the sense signals SAN and SAP2 are changed to the low level, while the stand-by signal STB is activated to a high level. Thus, since the transistors N21 and P21 forming the second driver circuit are turned on, an electric potential of VARY−VBIAS is supplied to the common source line PCS, and an electric potential of VSS+VRIAS is supplied to the common source line NCS. That is, the electric potential of the common source line PCS is lowered by the VBIAS, while the electric potential of the common source line NCS is raised by the VBIAS.

Consequently, since the operation electric potential to be supplied to the sense amplifier SA is lowered, the off-leak current flowing through the sense amplifier SA is reduced so that the current consumption is reduced. Moreover, since the second operation voltage VARY−2VBIAS is supplied to the paired bit lines BLT, BLB through the common source lines PCS, NCS, information read out through the paired bit lines BLT, BLB is prevented from being damaged.

Moreover, a restoration from the power down mode is carried out when the clock enable signal CKE is changed to the high level at time t15. The restoration from the power down mode is carried out by inactivating the stand-by signal STB into the low level, while the sense signals SAN and SAP2 are again activated to the high level. Thus, the first operation voltage VARY is again applied to the paired bit lines BLT and BLB. Moreover, by resetting the sub-word line SWL, while returning the sense signals SAN and SAP2 to the low level at time t16, the initial state prior to time t11 is restored.

In this case, the reason that the sense signals SAN, SAP2 are once set to the high level is because by setting the selected memory cell MC to the restore level, that is, by giving the electric potential of the VARY level or the VSS level thereto, it becomes possible to carry out the restoring operation correctly.

The above-mentioned description describes the configuration of the driver circuit and the operations thereof in accordance with the first embodiment. In this manner, in the present embodiment, in the case when the power down command is issued in the active state, it becomes possible to reduce the off-leak current transmitted through the sense amplifier SA since the operation voltage to be applied to the common source lines PCS and NCS is lowered. Moreover, during this period, the information on the bit lines is prevented from being damaged since the predetermined second operation voltage VARY−2VBIAS is given to the paired bit lines BLT, BLB.

Next, the following description will discuss a second embodiment of the present invention.

Figure 7:
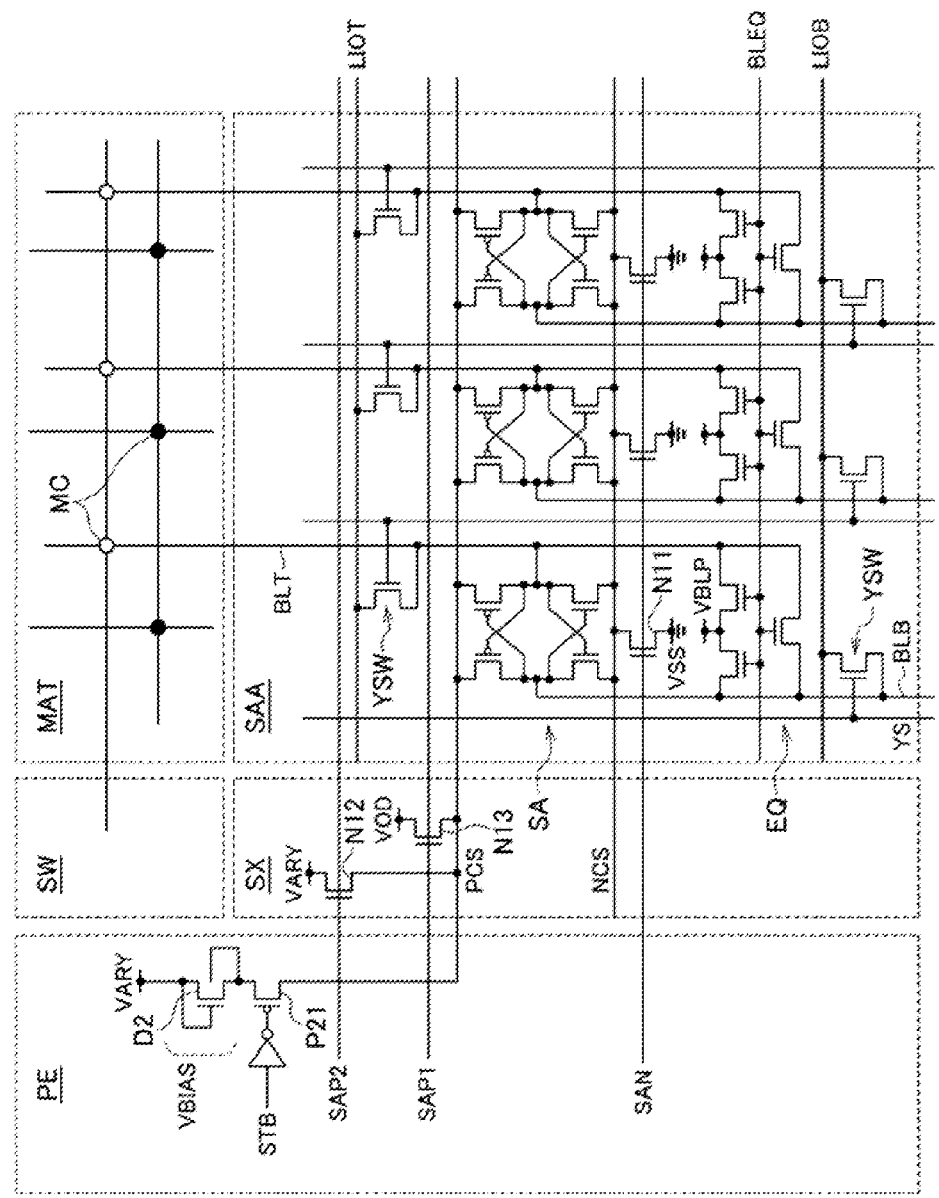
FIG. 7 is a circuit diagram showing a driver circuit in accordance with a second embodiment.

FIG. 7 is a circuit diagram showing a driver circuit in accordance with the second embodiment.

As shown in FIG. 7, the second embodiment is different from the first embodiment shown in FIG. 5 in that the transistor N21 and the diode D1 forming the second driver circuit are omitted. The other configurations are the same as those of the first embodiment; therefore, the same elements are indicated by the same reference numerals, and the overlapped descriptions thereof will be omitted.

Figure 8:
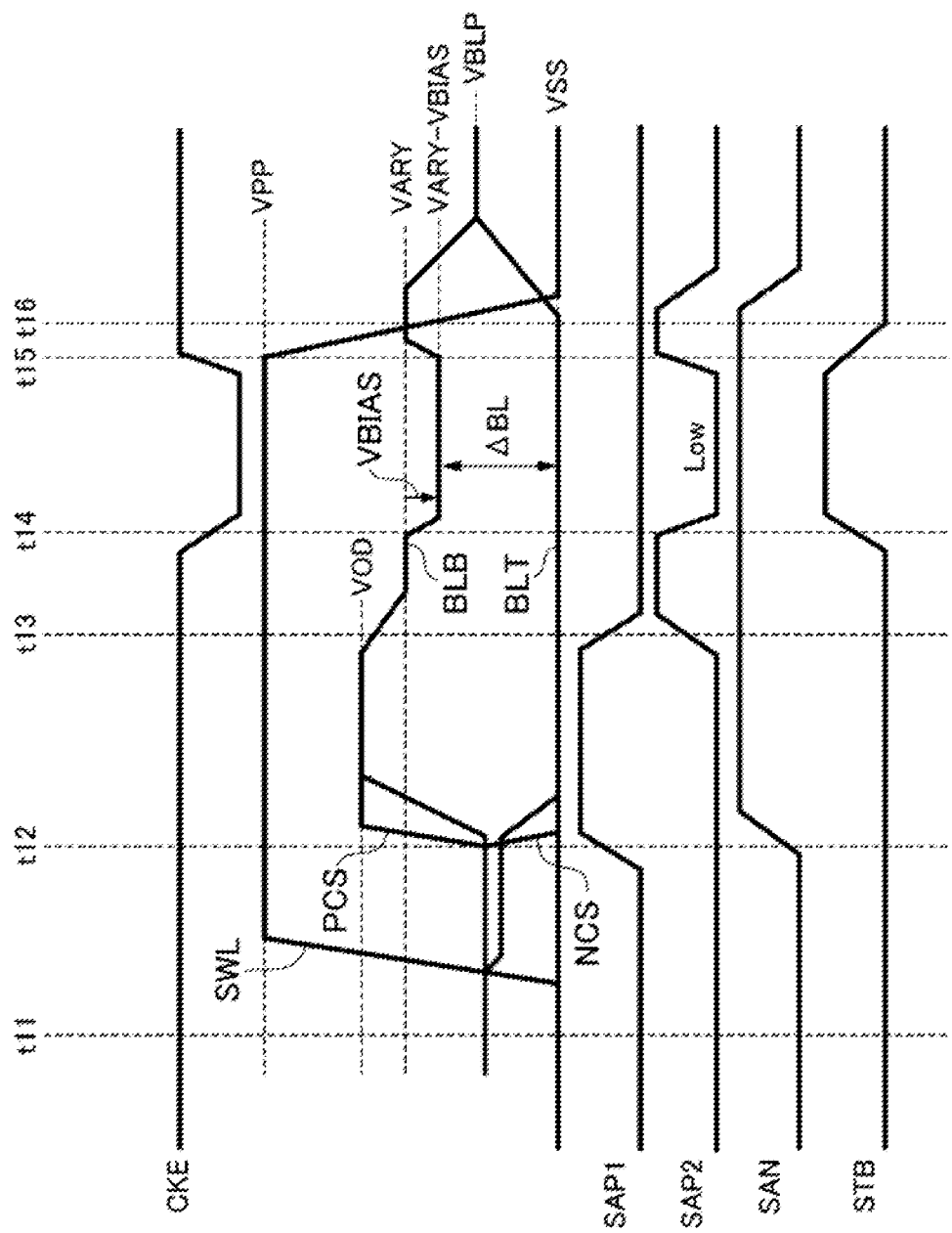
FIG. 8 is a waveform diagram that explains operations of the driver circuit in accordance with the second embodiment.

FIG. 8 is a waveform diagram for use in explaining operations of a driver circuit in accordance with the second embodiment.

As shown in FIG. 8, the waveforms of the sense signals SAP1, SAP2 and the stand-by signal STB in the second embodiment are the same as those of the first embodiment. The sense signal SAN is activated to the high level even during the period from time t14 to time t15. In this case, however, since the transistor N21 and the diode D1 are omitted, the electric potential VARY−VBIAS is supplied to the common source line PCS when the power down command is issued, while the electric potential to be supplied to the common source line NCS remains as VSS. In other words, only the electric potential of the common source line PCS is lowered by the VBIAS.

Thus, since the operation electric potential to be supplied to the sense amplifier SA at the time of the power down mode is lowered, the off-leak current flowing through the sense amplifier SA is reduced so that the current consumption is reduced in the same manner as in the first embodiment. Moreover, since the second operation voltage VARY−VBIAS is given to the paired bit lines BLT, BLB through the common source lines PCS, NCS, information read out through the paired bit lines BLT, BLB is prevented from being damaged.

Next, the following description will discuss a third embodiment of the present invention.

Figure 9:
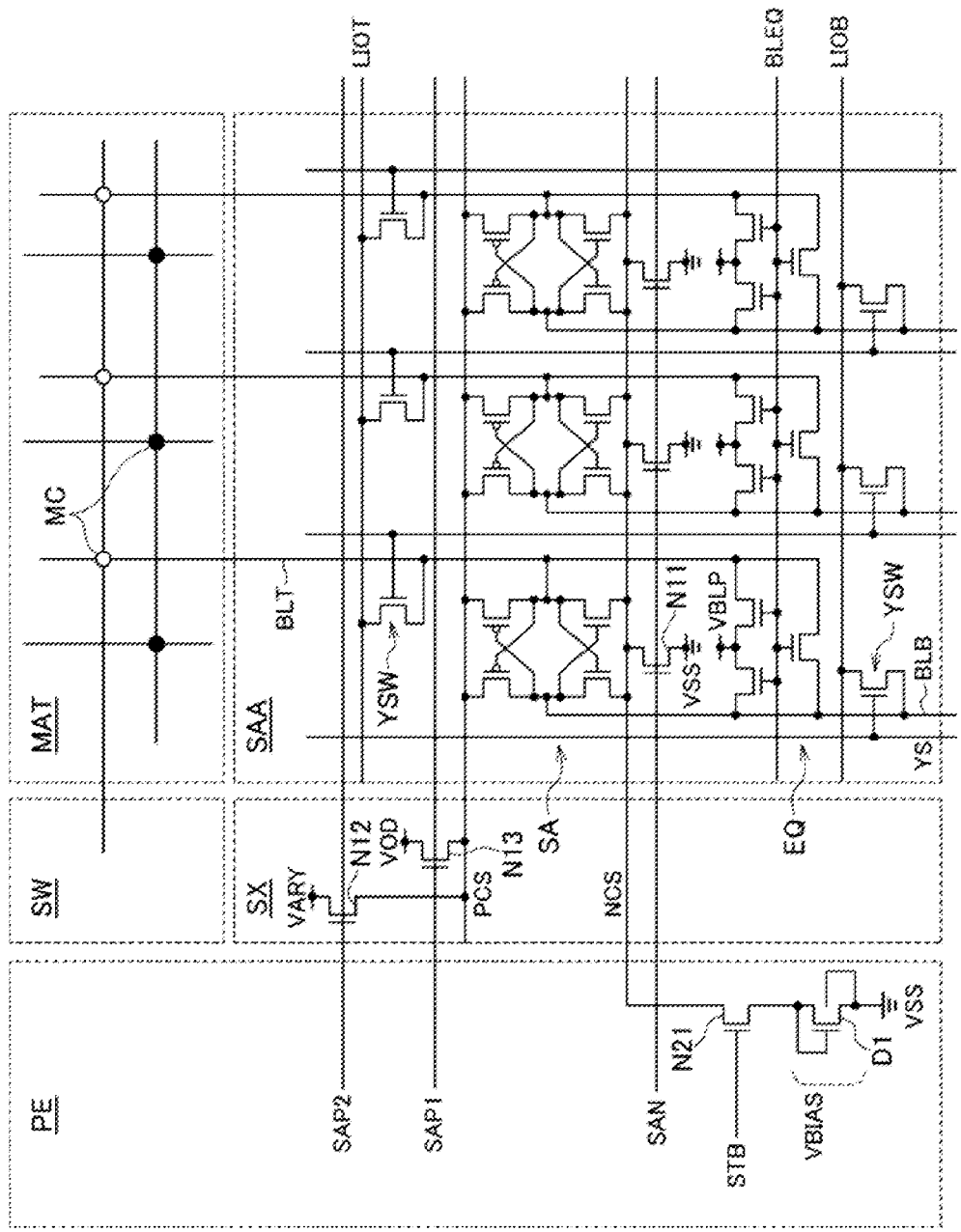
FIG. 9 is a circuit diagram showing a driver circuit in accordance with a third embodiment.

FIG. 9 is a circuit diagram showing a driver circuit in accordance with the third embodiment.

As shown in FIG. 9, the third embodiment is different from the first embodiment shown in FIG. 5 in that the transistor P21 and the diode D2 forming the second driver circuit are omitted. The other configurations are the same as those of the first embodiment; therefore, the same elements are indicated by the same reference numerals, and the overlapped descriptions will be omitted.

Figure 10:
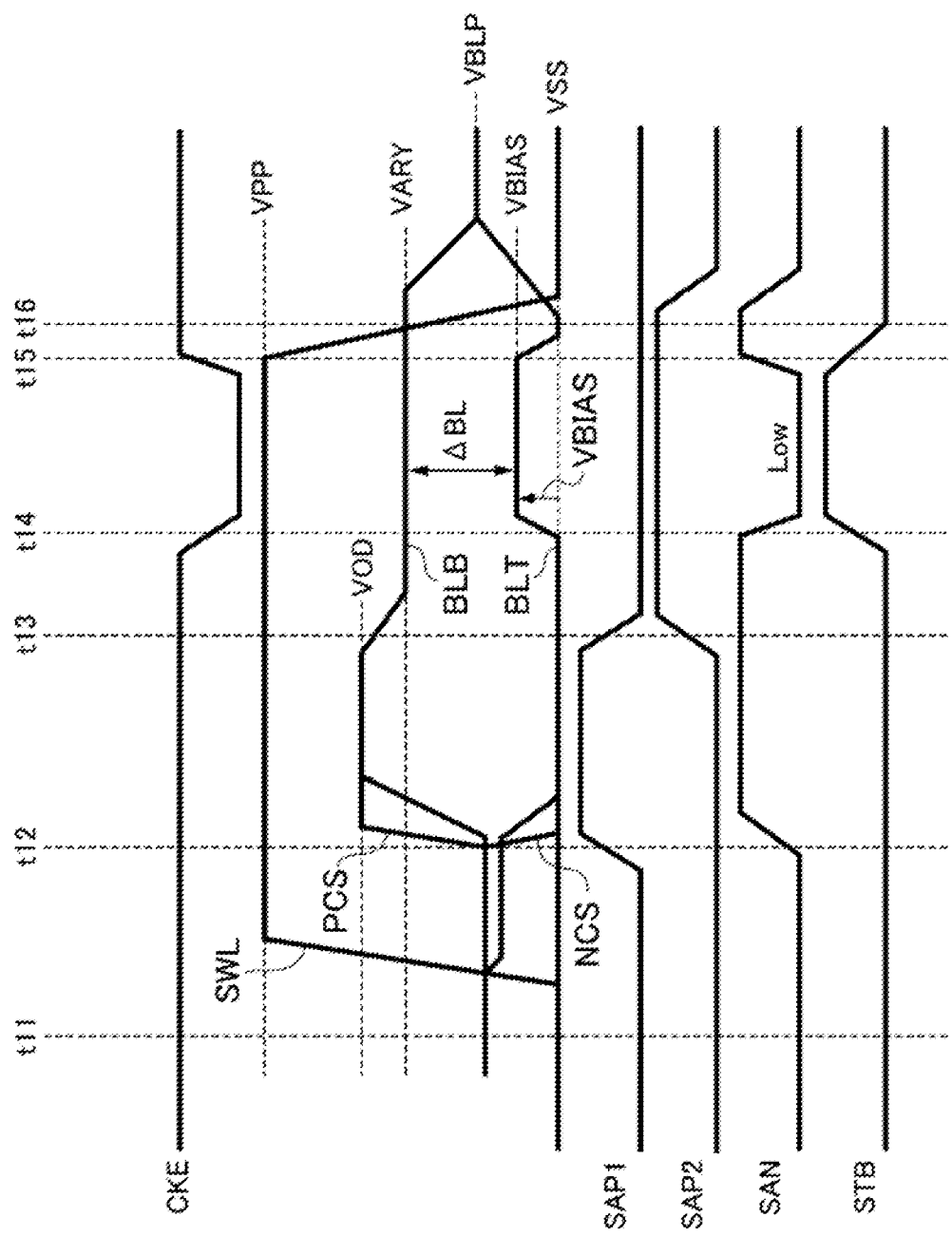
FIG. 10 is a waveform diagram that explains operations of the driver circuit in accordance with the third embodiment.

FIG. 10 is a waveform diagram for use in explaining operations of a driver circuit in accordance with the third embodiment.

As shown in FIG. 10, the waveforms of the sense signals SAN, SAP1 and the stand-by signal STB in the third embodiment are the same as those of the first embodiment. The sense signal SAP2 is activated to the high level even during the period from time t14 to time t15. In this case, however, since the transistor P21 and the diode D2 are omitted, the electric potential VSS+VBIAS is supplied to the common source line NCS when the power down command is issued, while the electric potential to be supplied to the common source line PCS remains as VARY. In other words, only the electric potential of the common source line NCS is raised by the VBIAS.

Thus, since the operation electric potential to be supplied to the sense amplifier SA at the time of the power down mode is lowered, the off-leak current flowing through the sense amplifier SA is reduced so that the current consumption is reduced in the same manner as in the first embodiment. Moreover, since the second operation voltage VARY−VBIAS is given to the paired bit lines BLT, BLB through the common source lines PCS, NCS, information read out through the paired bit lines BLT, BLB is prevented from being damaged.

Next, the following description will discuss a fourth embodiment of the present invention.

Figure 11:
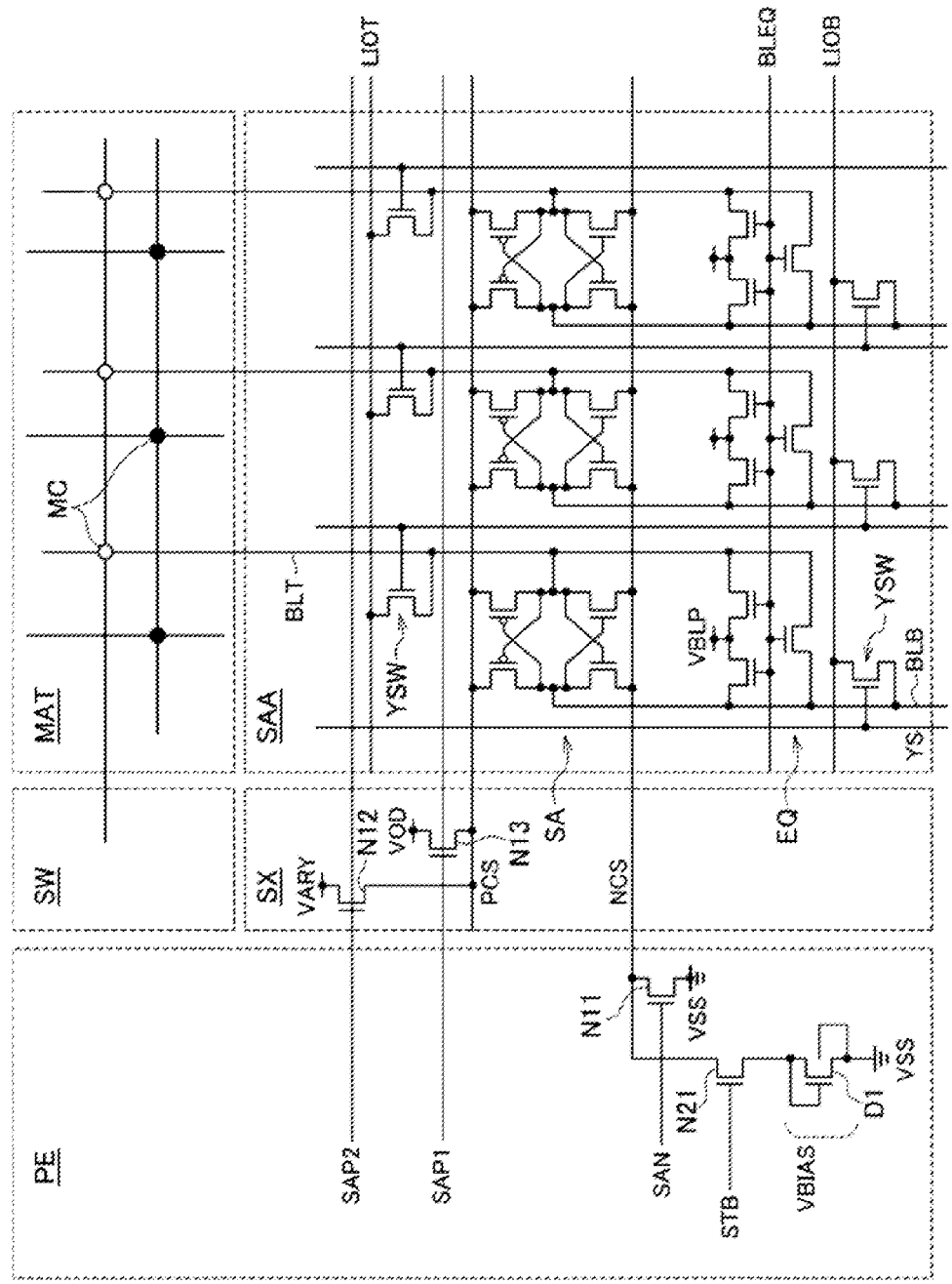
FIG. 11 is a circuit diagram showing a driver circuit in accordance with a fourth embodiment.

FIG. 11 is a circuit diagram showing a driver circuit in accordance with the fourth embodiment.

As shown in FIG. 11, the fourth embodiment is different from the third embodiment shown in FIG. 9 in that the transistor N11 forming the first driver circuit is disposed in a peripheral circuit region. The other configurations are the same as those of the third embodiment; therefore, the same elements are indicated by the same reference numerals, and the overlapped descriptions will be omitted. The present embodiment makes it possible to provide the same effects as those of the third embodiment, and also to reduce the area of the sense amplifier region SAA, as well as reducing a charging/discharging current caused by the switching of the transistor N11.

Figure 12:
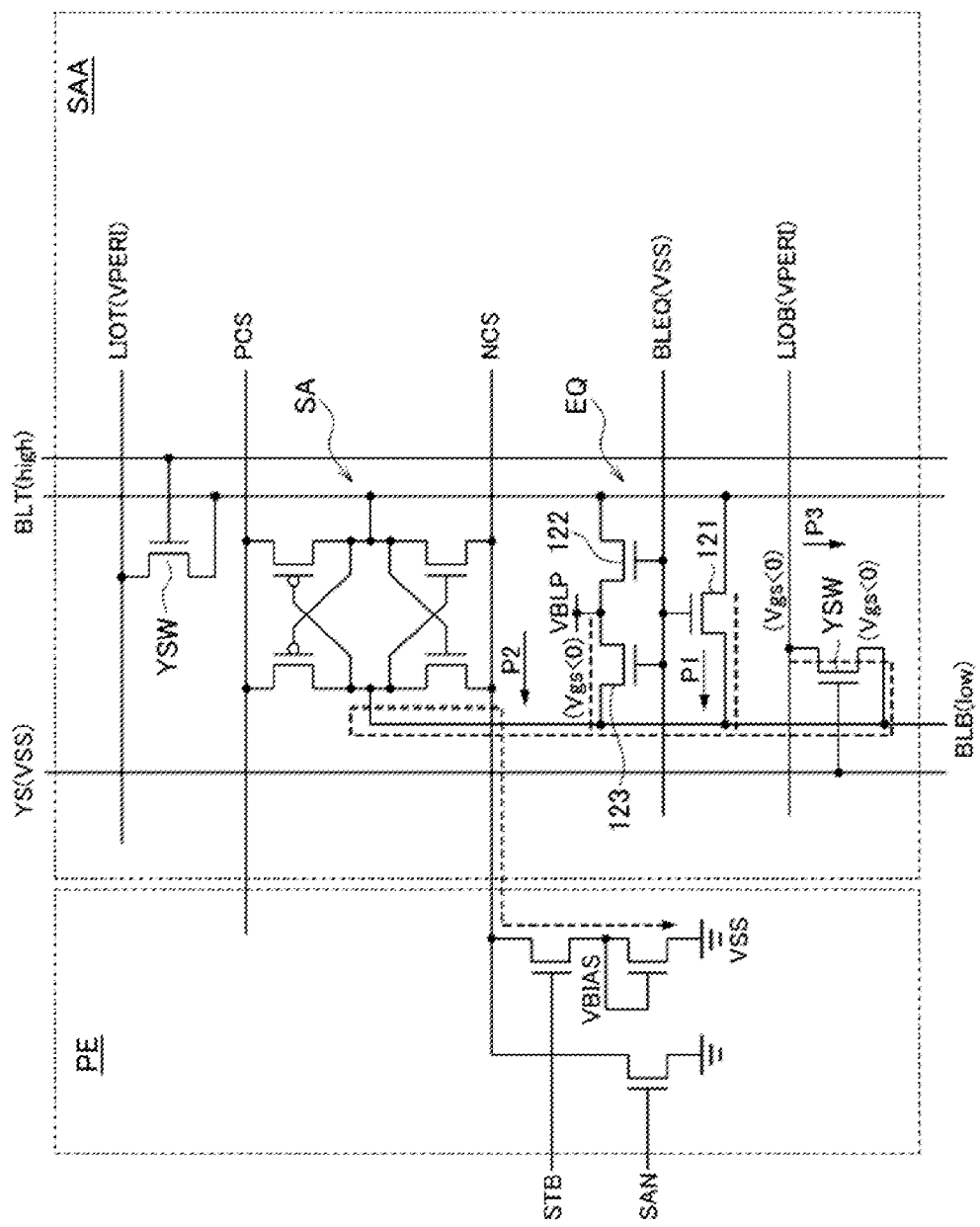
FIG. 12 is a view for explaining a path through which an off-leak current flows in the fourth embodiment.

FIG. 12 is a drawing for use in explaining a path through which the off-leak current flows in the fourth embodiment.

An example shown in FIG. 12 indicates a state in which one of the paired bit lines BLT is driven to the high level by the sense amplifier SA, with the other paired bit line BLB being driven to the low level. In this case, as paths for the off-leak current flowing through the VSS line, a leak path extending through the equalize circuits EQ indicated by reference signs P1 and P2 and a leak path extending through the local input/output line indicated by reference sign P3 are included.

However, in the present embodiment, the electric potential of the common source line NCS at the time of the power down becomes VSS+VBIAS so that since the level of the paired bit line BLB is also floated to VSS+VBIAS, the voltage between the gate and source of the transistor located at each leak path is lowered. For example, in the paths indicated by reference signs P1 and P2, the off-leak current flowing through the transistors 121 and 123 is reduced since the voltage Vgs between the gate and source of the transistors 121 and 123 forming the equalize circuit EQ becomes a negative electric potential (Vgs<0). Moreover, in the path indicated by reference sign P3, the off leak current flowing through the column switch YSW is reduced since the voltage Vgs between the gate and source of the column switch YSW becomes a negative electric potential (Vgs<0). By using this mechanism, it becomes possible to greatly reduce the off-leak current.

Figure 13:
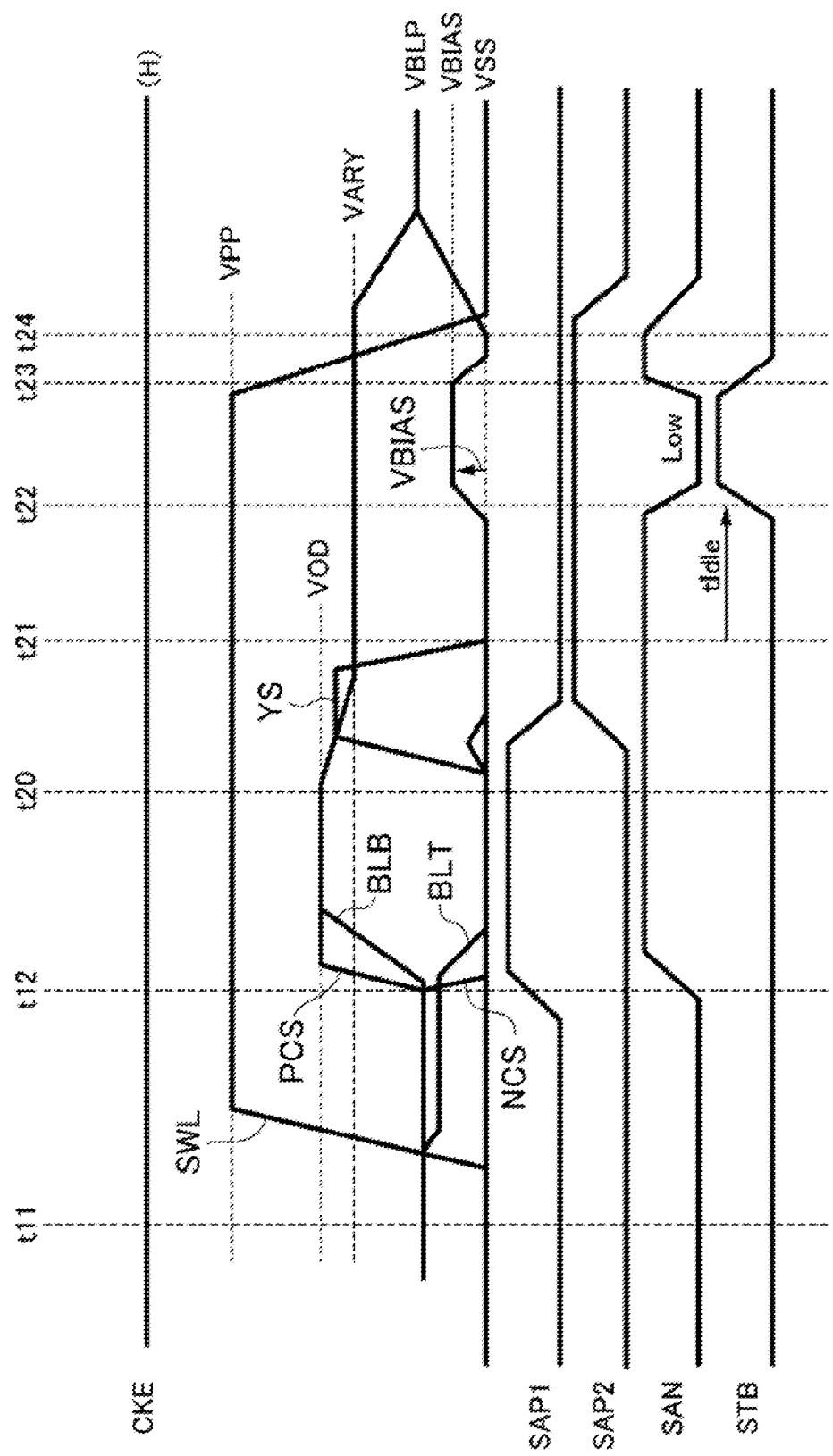
FIG. 13 is a waveform diagram that explains another operation of the driver circuit in accordance with the third and fourth embodiments.

FIG. 13 is a waveform diagram explaining another operation of a driver circuit in accordance with third and fourth embodiments.

As shown in FIG. 13, operations from time t11 to t12 are the same as those shown in FIG. 6; however, in the present embodiment, a read command is issued at time t20. In the case when the read command is issued, a predetermined column selection signal YS is changed to a high level based upon an inputted address signal ADD (column address). Thus, the corresponding paired bit lines BLT, BLB are connected to local input/output lines LIOT/LIOB.

Moreover, in the case when no read command or write command is issued over a predetermined period tIdle from time t21 at which the above-mentioned reading operation has been completed, at time t22 at which the period tIdle has elapsed, the sense signal SAN is changed to a low level, while the stand-by signal STB is activated to the high level. Thus, since the transistor N21 forming the second driver circuit is turned on, an electric potential of VSS+VBIAS is supplied to the common source line NCS. In other words, the electric potential of the common source line NCS is raised by VBIAS. Thus, in the same manner as in the case when the power down command is issued, the off-leak current flowing through the sense amplifier SA is reduced, thereby making it possible to reduce the consumption current.

Furthermore, when a precharge command is issued at time t23, the stand-by signal STB is returned to the low level, with the sense signal SAN being temporarily activated to the high level. Thereafter, when the sense signals SAN and SAP2 are returned to the low level at time t24, the sequence is returned to the initial state before time t11.

In this manner, the operation voltage of the sense amplifier SA can be reduced not only when the power down command is issued externally, but also when no read command or write command is issued during a predetermined period in the active state.

In any of the above-mentioned first to fourth embodiments, the effect for reducing the off-leak current flowing through the sense amplifier SA can be obtained; however, since the obtained characteristic is different depending on the respective embodiments, selection is desirably made in accordance with the target characteristic.

Prior to explanations of the characteristics of the first to fourth embodiments, the following description will discuss the configuration and operations of a driver circuit in accordance with a comparative example.

Figure 14:
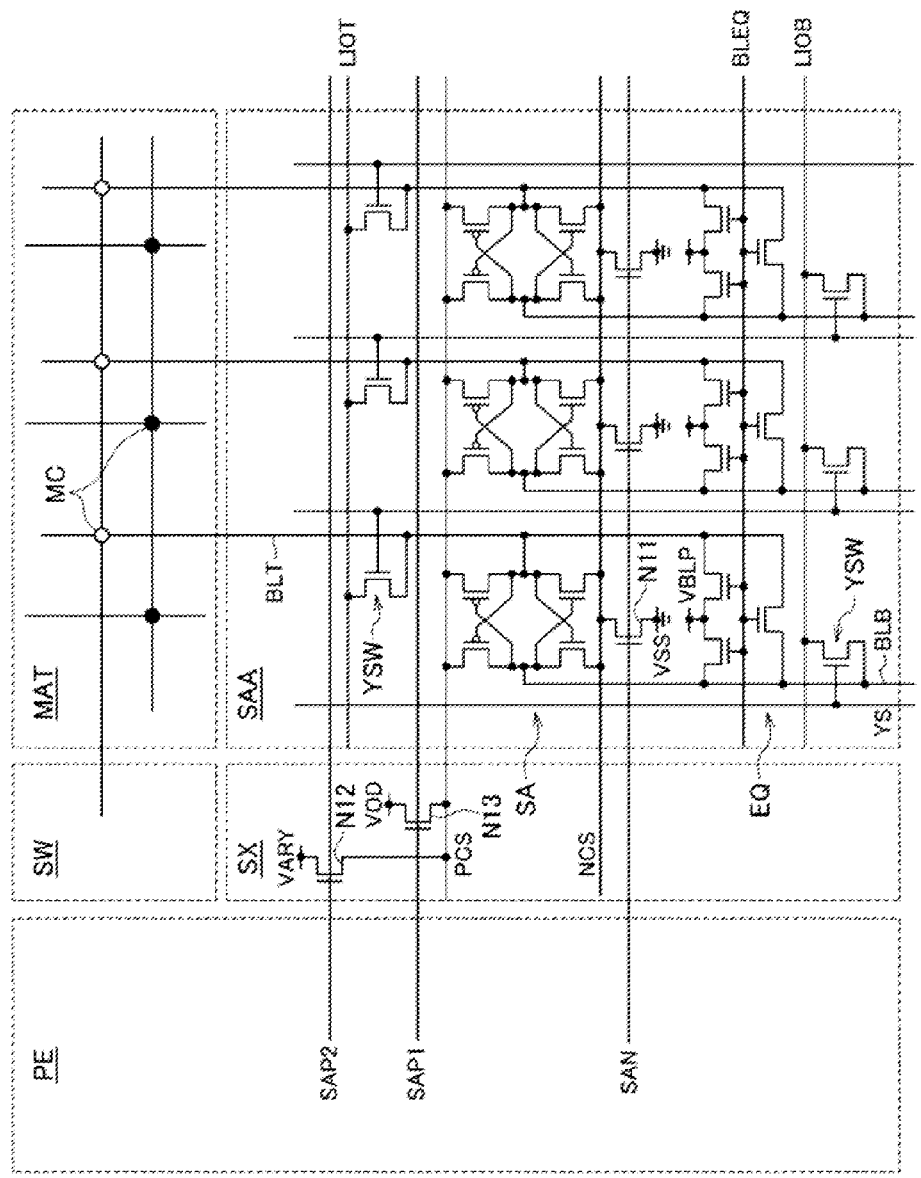
FIG. 14 is a circuit diagram showing a driver circuit in accordance with a comparative example.

FIG. 14 is a circuit diagram showing the driver circuit in accordance with the comparative example.

As shown in FIG. 14, the driver circuit of the comparative example is not provided with the second driver circuit, and is constituted only by the first driver circuit. The other configurations are the same as those of the first to fourth embodiments.

Figure 15:
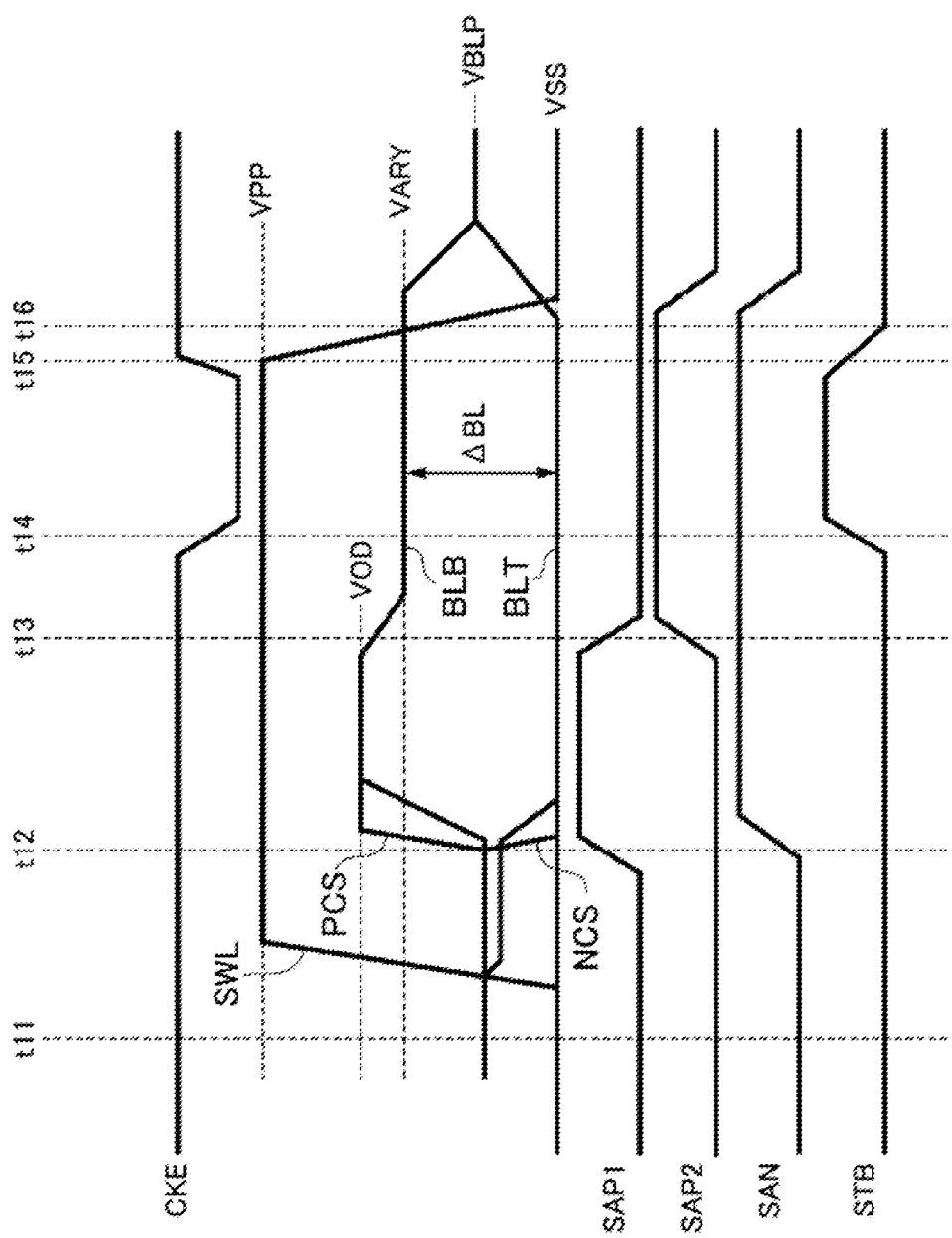
FIG. 15 is a waveform diagram that explains a first operation of the driver circuit in accordance with the comparative example.

FIG. 15 is a waveform diagram for use in explaining the first operation of the driver circuit in accordance with the comparative example.

In the example shown in FIG. 15 as well, the power down command is issued at time t14, and the corresponding semiconductor device 10 is consequently set in the low current consumption state. However, in the comparative example, since the second driver circuit is not installed, the internal electric potential VARY and the ground electric potential VSS are continuously supplied to the common source lines PCS and NCS respectively even in the power down mode. Thus, since the off-leak current flowing through the sense amplifier SA is generated, it is not possible to sufficiently reduce the current consumption of the semiconductor device 10 in the power down mode.

Figure 16:
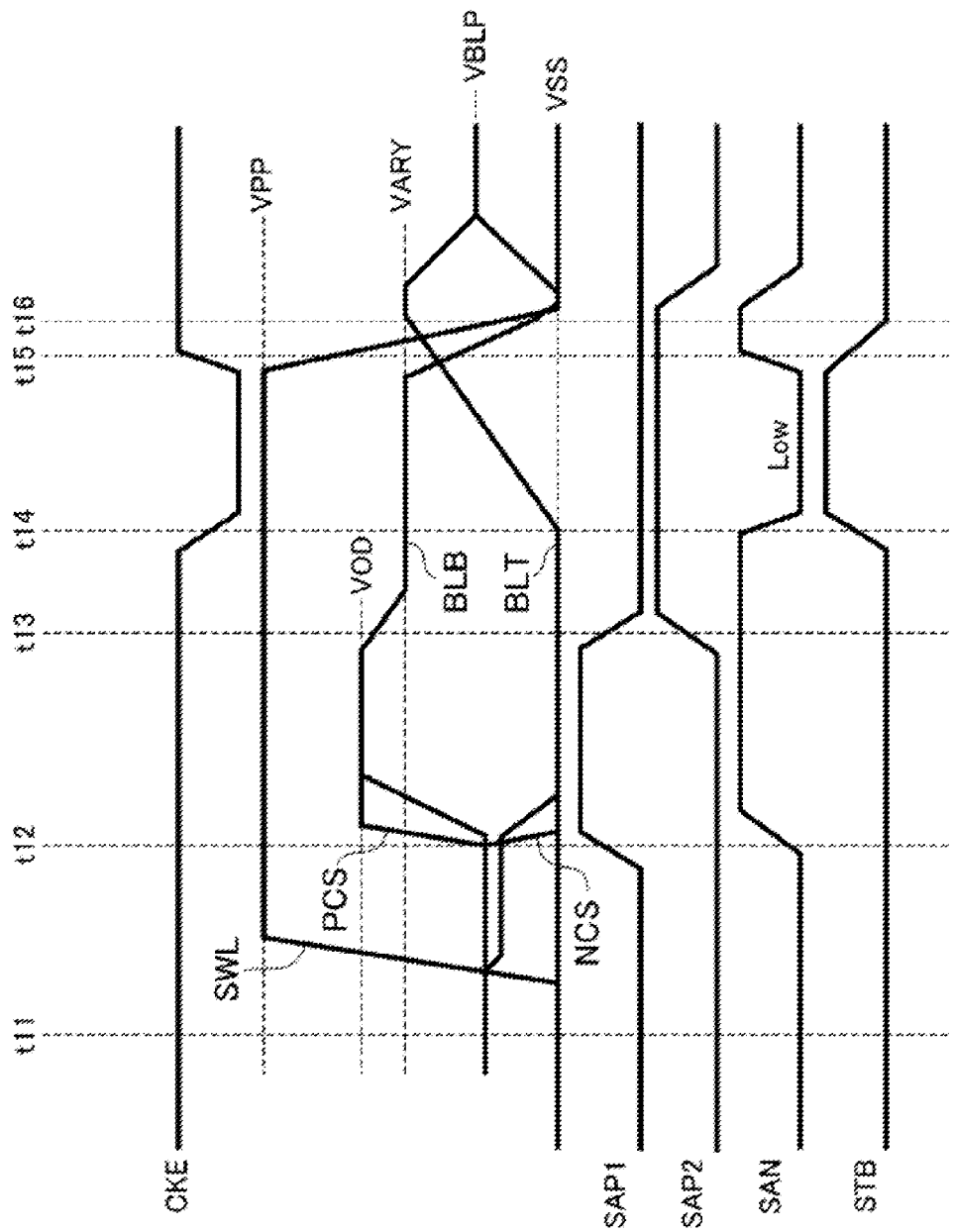
FIG. 16 is a waveform diagram that explains a second operation of the driver circuit in accordance with the comparative example.

FIG. 16 is a waveform diagram for use in explaining the second operation of the driver circuit in accordance with the comparative example.

In the example shown in FIG. 16, when a power down command is issued at time t14, the sense signal SAN is inactivated to a low level. Thus, since the common source line NCS is brought into a floating state, an off-leak current flowing through the VSS line through the sense amplifier SA is reduced.

However, in the case when the common source line NCS is brought into the floating state, the electric potential of the paired bit line BLT is gradually raised by a current flowing through the common source line NCS via the sense amplifier SA. In the example shown in FIG. 16, after the power down command has been issued, since the electric potential of the paired bit line BLT is raised, the sense amplifier SA is inverted, with the result that data read out from the memory cell MC is damaged.

In this manner, in the case when the sense signal SAN (or SAP2) is simply inactivated, read data may be damaged. In contrast, in the above-mentioned first to fourth embodiments, not only is the sense signal SAN or SAP2 simply inactivated, but also the operation voltage of the sense amplifier SA is reduced by using the second driver circuit; therefore, damaged data are not generated.

The following description will discuss characteristics of the first to fourth embodiments.

Figure 17:
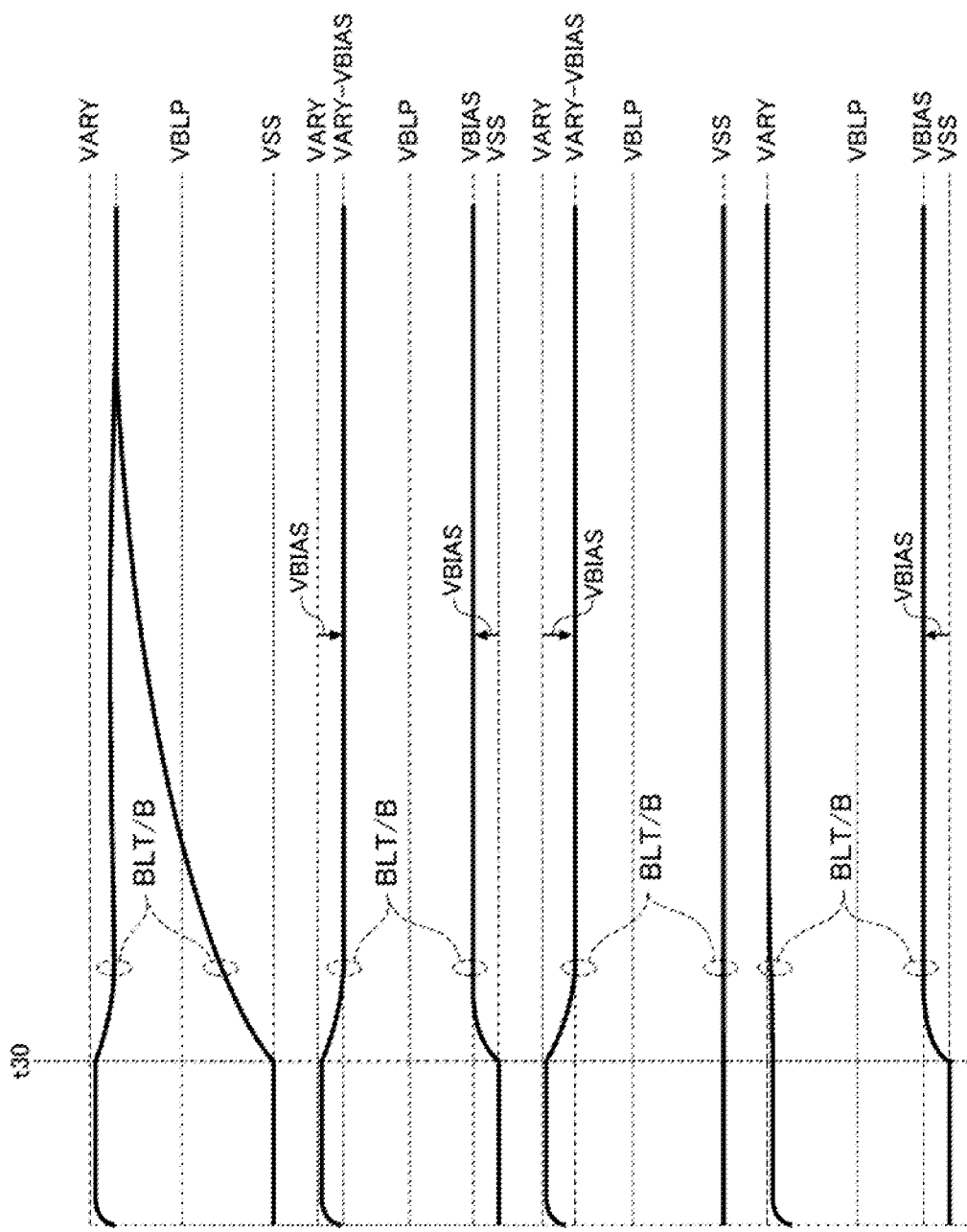
FIGS. 17(*a*) to (*d*) are waveform diagrams each showing a potential change in bit paired lines in response to the issuance of a power down command.
Figure 18:
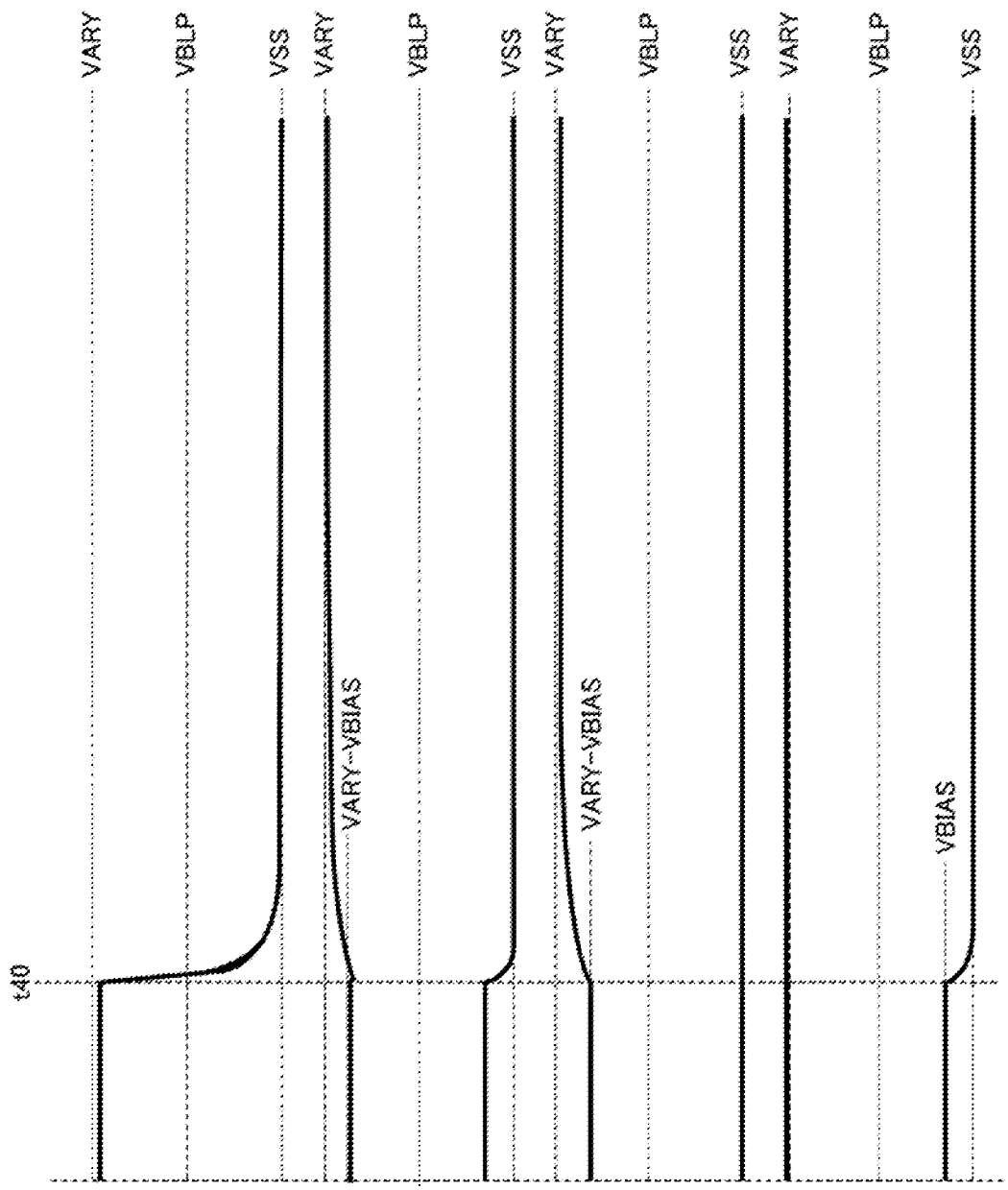
FIGS. 18(*a*) to (*d*) are waveform diagrams each showing a potential change in bit paired lines at the time of restoring from the power down mode.

FIGS. 17(a) to (d) are waveform diagrams showing an electric potential change of each of the paired bit lines BLT and BLB in response to an issuance of the power down command. In this case, FIG. 17(a) indicates the characteristic of the comparative example, FIG. 17(b) indicates the characteristic of the first embodiment, FIG. 17(c) indicates the characteristic of the second embodiment, and FIG. 17(d) shows characteristics of the third and fourth embodiments. These points are the same as those of FIGS. 18 to 21 to be described later.

As shown in FIG. 17(b), in the first embodiment, in the case when the power down command is issued at time t30, one of the paired bit lines BLT and BLB is lowered from the VARY level to the VARY−VBIAS level, while the other of the paired bit lines BLT and BLB is raised from the VSS level to the VBIAS level. With this arrangement, the voltage between the bit line BLT and the bit line BLB is lowered to VARY−2VBIAS.

As shown in FIG. 17(c), in the second embodiment, in the case when the power down command is issued, although one of the paired bit lines BLT and BLB is lowered from the VARY level to the VARY−VBIAS level, the other of the paired bit lines BLT and BLB is kept in the VSS level. With this arrangement, the voltage between the bit line BLT and the bit line BLB is lowered to VARY VBIAS.

As shown in FIG. 17(d), in the third embodiment and fourth embodiment, in the case when the power down command is issued, although one of the paired bit lines BLT and BLB is raised from the VSS level to the VBIAS level, the other of the paired bit lines BLT and BLB is kept in the VARY level. With this arrangement, the voltage between the bit line BLT and the bit line BLB is lowered to VARY−VBIAS.

In contrast to these, as shown in FIG. 17(a), in the comparative example, in the case when the power down command is issued, one of the paired bit lines BLT and BLB is gradually raised from the VSS level to finally reach the VARY level. For this reason, after a predetermined period has elapsed since the issuance of the power down command, data read out from the memory cell MC are damaged.

FIGS. 18(a) to (d) are waveform diagrams showing an electric potential change between the paired bit lines BLT and BLB upon restoration from the power down mode.

As shown in FIG. 18(b), in the first embodiment, when a restoration is made from the power down mode at time t40, one of the paired bit lines BLT and BLB is raised from the VARY–VBIAS level to the VARY level, while the other of the paired bit lines BLT and BLB is lowered from the VBIAS level to the VSS level. However, due to a problem with the current driving capability of the P channel-type MOS transistors 111 and 112 constituting the sense amplifier SA, the restoration from the VARY–VBIAS level to the VARY level requires a certain period of time. On the other hand, the restoration from the VBIAS level to the VSS level is carried out comparatively at high speed.

As shown in FIG. 18(c), in the second embodiment also, when a restoration is made from the power down mode, one of the paired bit lines BLT and BLB is raised from the VARY–VBIAS level to the VARY level. In this case also, the restoration from the VARY–VBIAS level to the VARY level requires a certain period of time.

As shown in FIG. 18(d), in the third and fourth embodiments also, when a restoration is made from the power down mode, one of the paired bit lines BLT and BLB is lowered from the VBIAS level to the VSS level. In this case also, the restoration from the VBIAS level to the VSS level is carried out comparatively at high speed.

In contrast to these, as shown in FIG. 18(a), in the comparative example, in the case when one of the paired bit lines BLT and BLB, which is kept in the floating state, is raised to the VARY level or to the vicinity thereof, data are damaged upon restoring from the power down command.

Figure 19:
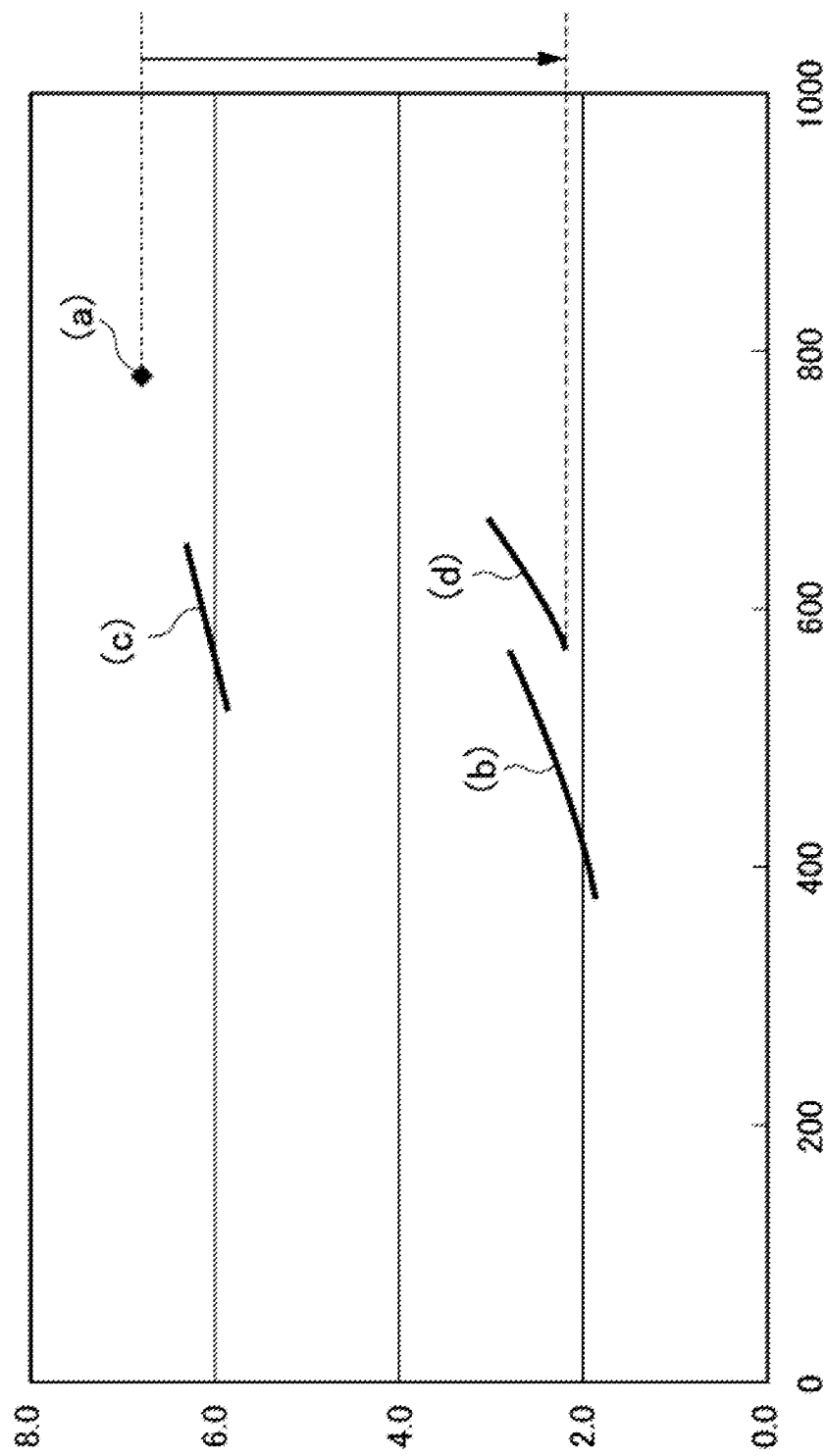
FIG. 19 is a graph showing a relationship between a voltage between the bit lines and a consumption current in the power down mode.

FIG. 19 is a graph showing a relationship between the voltage between the bit lines and the consumption current in the power down mode.

Numerical values in the comparative example correspond to numerical values for use in carrying out the first operation shown in FIG. 15. These points are the same as those in FIG. 20 and FIG. 21 to be described later.

As shown in FIG. 19, in the first to fourth embodiments, current consumption in the power down mode is reduced in comparison with that in the comparative example. In particular, in the first, third and fourth embodiments, the consumption current is cut by about 70% in comparison with that of the comparative example.

Figure 20:
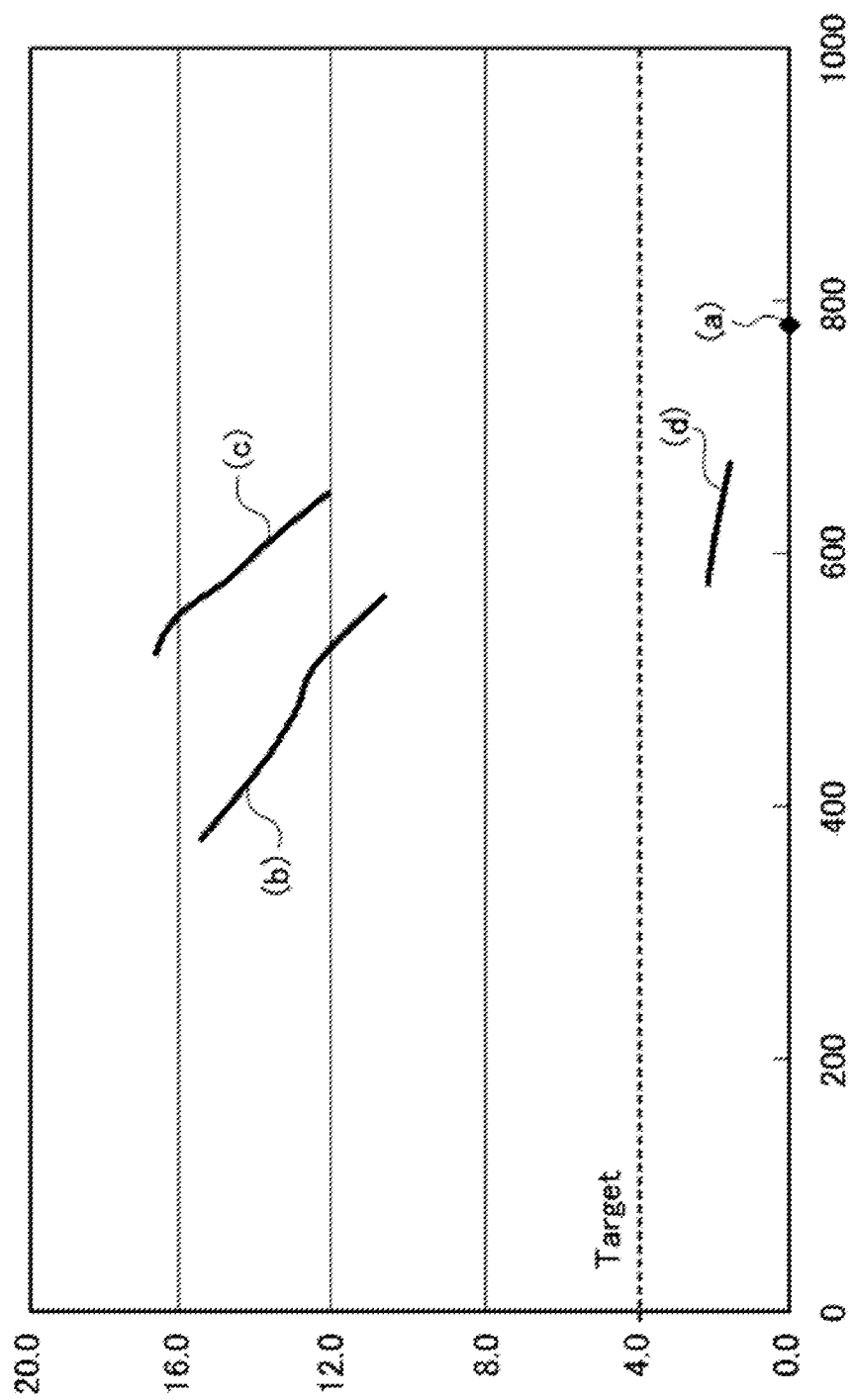
FIG. 20 is a graph showing a relationship between a voltage between the bit lines in the power down mode and the restoring time from the power down mode.

FIG. 20 is a graph showing a relationship between the voltage between the bit lines in the power down mode and restoring time from the power down mode. In this case, the restoring time refers to a period of time required for the voltage between the bit lines to be changed by 20 mV.

As shown in FIG. 20, since the voltage between the hit lines in the power down mode is reduced in the first to fourth embodiments, the restoration to the bit line level requires a certain degree of time. However, since the restoring time is very short in the third and fourth embodiments, even in the case when as explained by reference to FIG. 13, the operation voltage of the sense amplifier SA is lowered in an active state, it becomes possible to start the reading operation or the writing operation immediately after the issuance of the read command or the write command.

Figure 21:
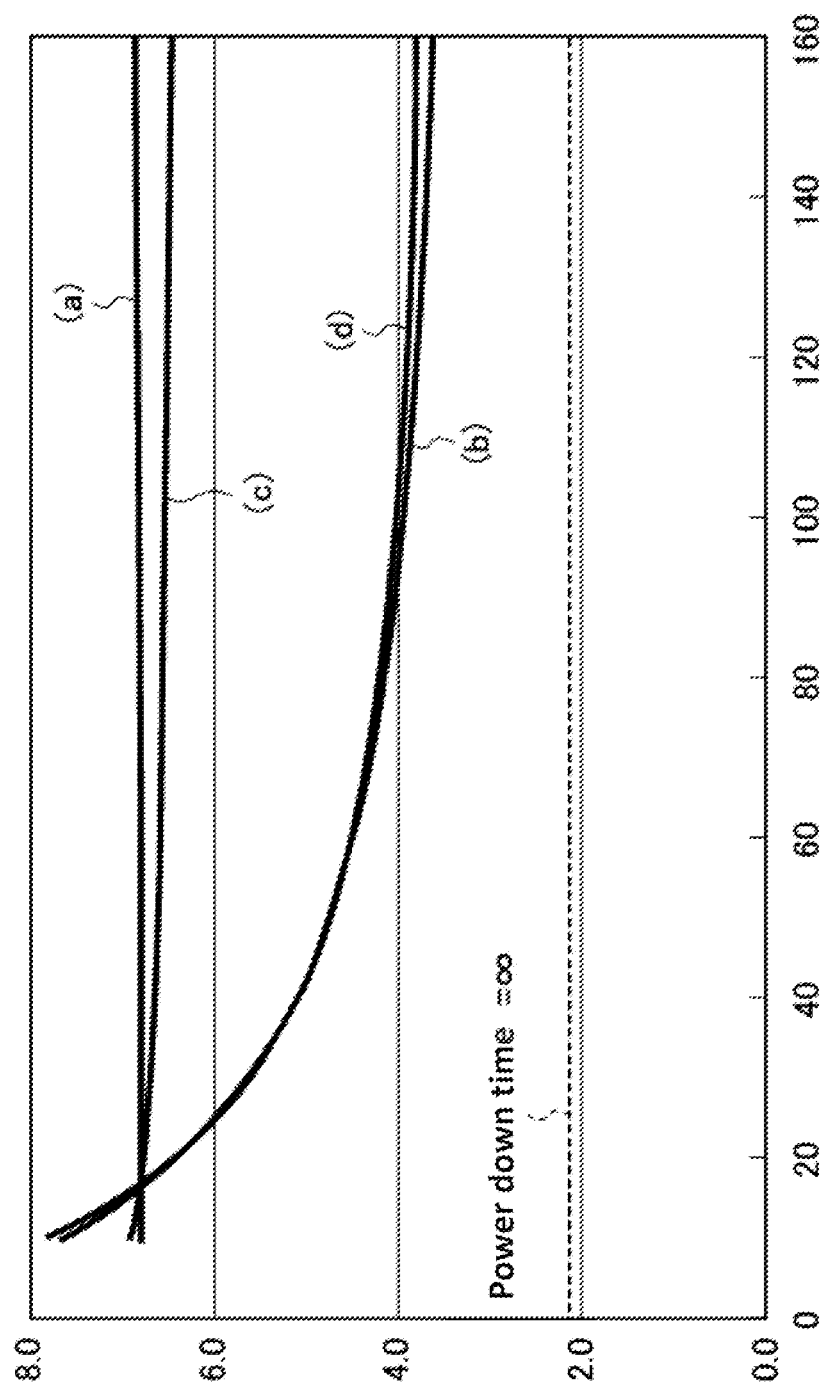
FIG. 21 is a graph showing a relationship between the power down period and consumption current.

FIG. 21 is a graph showing a relationship between the power down period and the current consumption.

As shown in FIG. 21, in the first, third and fourth embodiments, immediately after entering the power down mode, the current consumption is temporarily increased. This is because a consumption current is generated by switching the transistors N11 and N21 for driving the common source line NCS. However, after a lapse of about 20 ns from the power down, the current consumption becomes smaller than that of the comparative example so that it is finally cut by about 70%.

As described above, preferred embodiments of the present invention have been explained; however, the present invention is not intended to be limited by the embodiments, and it is needless to say that various modifications may be made therein within a scope not departing from the gist of the present invention, and those modifications are of course included within the scope of the present invention.

What is claimed is:

1. An apparatus, comprising:
   a memory cell;
   a cell transistor coupled to the memory cell;
   a bit line coupled to the cell transistor;
   a first driver circuit configured to provide a first power source voltage difference;
   a second driver circuit configured to provide a second power source voltage difference smaller than the first power source voltage difference;
   a sense amplifier configured to amplify a data signal on the bit line read out from the memory cell, the sense amplifier being configured to be operated in a first mode with the first power source voltage difference and to be operated in a standby mode with the second power source voltage difference; and
   a control circuit configured to activate the first driver in the first mode and to activate the second driver circuit in the standby mode when the cell transistor is activated.

2. The apparatus as claimed in claim 1, wherein the first mode comprises a normal mode.

3. The apparatus as claimed in claim 1, further comprising:
   a first line coupled to the sense amplifier;
   a first transistor coupled between the first line and a first node responsive to a first control signal, the first node being supplied with a first power source potential; and
   a second transistor coupled between the first line and a second node responsive to a second control signal, the second node being supplied with a second power source potential lower than the first power source potential.

4. The apparatus as claimed in claim 3, wherein the second control signal comprises a standby signal.

5. The apparatus as claimed in claim 3, further comprising a voltage step down element provided between the second node and a second line supplied with the first power source potential.

6. The apparatus as claimed in claim 5, wherein the voltage step down element comprises a diode.

7. The apparatus as claimed in claim 1, further comprising:
   a first line coupled to the sense amplifier;
   a first transistor coupled between the first line and a first node responsive to a first control signal, the first node being supplied with a first power source potential; and
   a second transistor coupled between the first line and a second node responsive to a second control signal, the second node being supplied with a second power source potential higher than the first power source potential.

8. The apparatus as claimed in claim 7, wherein the second control signal comprises a standby signal.

9. The apparatus as claimed in claim 8, further comprising a voltage step down element provided between the second node and a second line supplied with the first power source potential.

10. The apparatus as claimed in claim 9, wherein the voltage step down element comprises a diode.

11. An apparatus, comprising:
a memory cell;
a bit line coupled to the memory cell;
a sense amplifier configured to amplify a data signal on the bit line read out from the memory cell, the sense amplifier being configured to be operated in a first mode with a first power source voltage difference and to be operated in a standby mode with a second power source voltage difference smaller than the first power source voltage difference;
a first line coupled to the sense amplifier;
a first transistor coupled between the first line and a first node responsive to a first control signal, the first node being supplied with a first power source potential; and
a second transistor coupled between the first line and a second node responsive to a standby signal, the second node being supplied with a second power source potential higher than the first power source potential;
a diode provided between the second node and a second line supplied with the first power source potential;
a third line coupled to the sense amplifier;
a third transistor coupled between the third line and a third node responsive to a third control signal, the third node being supplied with a third power source potential higher than the first power source potential; and
a fourth transistor coupled between the third line and a fourth node responsive to the standby signal, the fourth node being supplied with a fourth power source potential lower than the third power source potential and higher than the first power source potential.

12. The apparatus as claimed in claim 11, further comprising a second voltage step down element provided between the fourth node and a fourth line supplied with the third power source potential.

13. The apparatus as claimed in claim 12, wherein the second voltage step down element comprises a second diode.

14. An apparatus, comprising:
a memory cell array comprising first and second bit lines;
first and second common source lines;
a first driver circuit configured to supply the first and second common source lines with a first power source voltage difference;
a second driver circuit configured to supply the first and second common source lines with a second power source voltage difference smaller than the first voltage difference;
a sense amplifier configured to be operated by the first or second power source voltage difference and amplify a voltage potential difference on the first and second bit lines; and
a control circuit configured to,
activate the first driver circuit responsive to an issuance of a first command by which the memory cell array changes from inactive state to active state,
deactivate the activated first driver circuit responsive to an issuance of a second command by which the memory cell array changes from the active state to the inactive state, and
activate the second driver circuit responsive to an issuance of a stand-by mode issued during a period after the issuance of the first command until the issuance of the second command.

15. The apparatus as claimed in claim 14,
wherein the control circuit is configured to deactivate the second activated driver circuit and activate the first driver circuit responsive to the issuance of the second command, then deactivate the activated first driver circuit.

16. The apparatus as claimed in claim 15, further comprising an equalize circuit configured to equalize potentials on the first and second common source lines, the equalize circuit being configured to be deactivated during a period after the issuance of the first command until the issuance of the second command.

17. The apparatus as claimed in claim 16, further comprising:
a first power source line supplied with a first power source potential; and
a second power source line supplied with a second power source potential,
wherein the first driver circuit comprises a first transistor coupled between the first power source line and the first common source line, and a second transistor coupled between the second power source line and the second common source line,
wherein the second driver circuit comprises a first diode coupled between the first power source line and the first common source line.

18. The apparatus as claimed in claim 17, wherein the second driver circuit comprises a second diode coupled between the second power source line and the second common source line.

19. The apparatus as claimed in claim 18, further comprising a third power source line supplied with an overdrive voltage potential,
wherein the first drive circuit comprises a third transistor coupled between the third power source line and the second power source line.

20. The apparatus as claimed in claim 19, wherein the third transistor is configured to turn on responsive to an active command.

* * * * *